US007035593B2

(12) United States Patent
Miller et al.

(10) Patent No.: US 7,035,593 B2
(45) Date of Patent: Apr. 25, 2006

(54) SIGNAL CLASSIFICATION METHODS FOR SCANNING RECEIVER AND OTHER APPLICATIONS

(75) Inventors: Karl A. Miller, Frederick, MD (US); David F. Mason, Germantown, MD (US)

(73) Assignee: Cognio, Inc., Germantown, MD (US)

( * ) Notice: Subject to any disclaimer, the term of this patent is extended or adjusted under 35 U.S.C. 154(b) by 32 days.

(21) Appl. No.: 10/830,414

(22) Filed: Apr. 22, 2004

(65) Prior Publication Data
US 2005/0032479 A1     Feb. 10, 2005

Related U.S. Application Data

(63) Continuation-in-part of application No. 10/628,603, filed on Jul. 28, 2003.

(60) Provisional application No. 60/481,706, filed on Nov. 26, 2003, provisional application No. 60/510,495, filed on Oct. 10, 2003.

(51) Int. Cl.
*H04B 17/00*     (2006.01)

(52) U.S. Cl. ............................. 455/67.11; 455/226.1; 375/340

(58) Field of Classification Search ............ 455/67.11, 455/226.1; 375/340, 343
See application file for complete search history.

(56) References Cited

U.S. PATENT DOCUMENTS 3,609,553 A     9/1971 Frazier et al. ............... 325/67

(Continued)

FOREIGN PATENT DOCUMENTS

CA     2260336     8/2000

(Continued)

OTHER PUBLICATIONS

Agilent Publication, "Agilent 89400 Series Vector Signal Analyzer Product Overview," 2000.

(Continued)

*Primary Examiner*—Simon Nguyen
(74) *Attorney, Agent, or Firm*—Edell, Shapiro, & Finnan, LLC

(57) ABSTRACT

Signal classification techniques for classifying signals occurring in a frequency band using a plurality of classifier procedures each dedicated to identify a particular signal or signal type. The classification procedures operate on spectrum activity data that may include pulse event data describing particular types of signal pulses occurring in the frequency band, power versus frequency data for sampling intervals of activity in a frequency band and/or raw analog-to-digital converter samples take of a received signal. The signal classification techniques are useful to identify wireless radio signals or other radio emissions occurring in an unlicensed radio frequency band. One type of classification procedure is a pulse timing template that is compared against accumulated signal pulse data to determine occurrence of a particular signal type. To enhance the pulse timing template signal classifier, techniques are provided to examine the center frequency distribution of signal pulses that match the timing template in order to confirm that certain signal pulses are associated with a particular frequency hopping signal type. This is particularly useful when the accumulated signal pulse data is obtained from a scanning radio receiver that is tuned to different portions/channels of the frequency band in which the frequency hopping signal is expected to hop.

52 Claims, 18 Drawing Sheets

U.S. PATENT DOCUMENTS

| | | | |
|---|---|---|---|
| 3,812,291 A | 5/1974 | Brodes et al. | 704/253 |
| 4,166,980 A | 9/1979 | Apostolos et al. | 325/363 |
| 4,271,523 A | 6/1981 | Gable | 714/811 |
| 4,501,020 A | 2/1985 | Wakeman | 455/226 |
| 4,597,107 A * | 6/1986 | Ready et al. | 455/226.1 |
| 4,845,707 A | 7/1989 | Isaacson et al. | 370/480 |
| 4,947,338 A | 8/1990 | Vistica | 364/485 |
| 4,979,211 A | 12/1990 | Benvenuto et al. | 704/251 |
| 5,005,210 A | 4/1991 | Ferrell | 455/115 |
| 5,144,642 A | 9/1992 | Weinberg et al. | 375/10 |
| 5,210,820 A | 5/1993 | Kenyon | 395/2 |
| 5,353,346 A | 10/1994 | Cox et al. | 379/386 |
| 5,432,862 A | 7/1995 | Hirsch | 382/207 |
| 5,608,727 A | 3/1997 | Perreault et al. | 370/462 |
| 5,651,030 A | 7/1997 | Wong et al. | 375/316 |
| 5,687,163 A * | 11/1997 | Fox et al. | 370/207 |
| 5,832,038 A | 11/1998 | Carsello | 375/216 |
| 5,905,949 A | 5/1999 | Hawkes et al. | 455/410 |
| 5,912,922 A | 6/1999 | Koszarsky et al. | 375/224 |
| 6,084,919 A | 7/2000 | Kleider et al. | 375/285 |
| 6,131,013 A * | 10/2000 | Bergstrom et al. | 455/63.1 |
| 6,226,680 B1 | 5/2001 | Boucher et al. | 709/230 |
| 6,240,282 B1 * | 5/2001 | Kleider et al. | 455/226.1 |
| 6,240,372 B1 | 5/2001 | Gross et al. | 702/71 |
| 6,263,031 B1 * | 7/2001 | Beidas et al. | 375/343 |
| 6,385,434 B1 | 5/2002 | Chuprun et al. | 455/11.1 |
| 6,463,294 B1 | 10/2002 | Holma et al. | 455/513 |
| 6,466,614 B1 | 10/2002 | Smith | 375/224 |
| 6,519,541 B1 | 2/2003 | Bitton | 702/76 |
| 6,629,151 B1 | 9/2003 | Bahl | 709/250 |
| 6,697,013 B1 | 2/2004 | McFarland et al. | |
| 6,714,605 B1 | 3/2004 | Sugar et al. | 375/340 |
| 6,850,735 B1 * | 2/2005 | Sugar et al. | 455/67.11 |
| 2001/0019543 A1 | 9/2001 | Mueckenheim et al. | 370/329 |
| 2002/0086641 A1 | 7/2002 | Howard | 455/67.1 |
| 2002/0137485 A1 | 9/2002 | Nilsson et al. | 455/184.1 |
| 2002/0142744 A1 | 10/2002 | Okanoue et al. | 455/226.1 |
| 2002/0154614 A1 | 10/2002 | Jagger et al. | 370/332 |
| 2002/0155811 A1 | 10/2002 | Prismantas et al. | 455/63 |
| 2002/0173272 A1 | 11/2002 | Liang et al. | 455/63 |
| 2003/0040277 A1 | 2/2003 | Deats | 455/63 |
| 2003/0050012 A1 | 3/2003 | Black et al. | 455/62 |
| 2003/0224741 A1 | 12/2003 | Sugar et al. | 375/115.1 |
| 2004/0023674 A1 | 2/2004 | Miller et al. | 455/462 |
| 2004/0219885 A1 | 11/2004 | Sugar et al. | 455/67.11 |

FOREIGN PATENT DOCUMENTS

| | | |
|---|---|---|
| CA | 2298316 | 8/2000 |
| JP | 2000-022712 | 1/2000 |

OTHER PUBLICATIONS

Agilent Publication, "Agilent Technologies: 2G & 3G Solutions-Accelerating Progress," 2000.

Agilent Publication, "Agilent Technologies: Powerful Solutions To Complex Measurement Problems; Burst, Transient and Modulated Signal Analysis," 2000.

Agilent Publication, "Agilent PN 89400-8 Using Vector Modulation Analysis In The Integration, Troubleshooting And Design Of Digital RF Communications Systems," 2000 (and earlier).

Agilent Publication, "Agilent PN 89400-10 Time-Capture Capabilities Of The Agilent 89400 Series Vector Signal Analyzers," 2000 (and earlier).

Agilent Publication, "Agilent 89440A-1 Frequency And Time-Selective Power Measurements With The Agilent 89410A and 89440A," 2001 (and earlier).

Canadian Communications Research Center, "Spectrum Explorer Project Of Canadian Communications Research Center," 1998 (and later).

Standford Research Systems, "Stanford Research Systems SR785 Two Channel Dynamic Signal Analyzer," 1998.

Carlemalm, Catharina, "Suppression Of Multiple Narrowband Interferers In A Spread-Spectrum Communication System," Aug., 2000, IEEE Journal on Selected Areas in Communications, Special Issue on Broadband Communications, vol. 18.

Lo, Victor Yeeman, "Enhanced Spectral Analysis Tool (SAT) For Radio Frequency Interference Analysis And Spectrum Management," Milcom, 1998.

Tektronix, "Real-Time Spectrum Analysis Tools Aid Transition To Third-Generation Wireless Technology," 1999.

Patenaude, Francois et al., "Spectrum Surveillance: System Architecture," CRC-TN-97-001, Canadian Communications Research Centre, Apr. 15, 1997.

Mobilian Corporation, "WI-FI™ (802.11b) and BLUETOOTH™: an Examination of Coexistence Approaches," Mobilian Corporation, 2001.

RSMS Publication, "Radio Spectrum Measurement System (RSMS) Program-Functional Measurements," Jan. 29, 2001, 5 pages.

Schreyogg, Christoph et al., "Robust Classification Of Modulation Types Using Spectral Features Applied To HMM," 1997, 5 pages.

Tektronix, "Validation Testing Of Bluetooth Wireless LAN Systems," Tektronix Application Note, 2001.

Lallo, Pauli, "Signal Classification By Discrete Fourier Transform", Milcom Conference Proceedings,1999.

Quint et al., "Emitter Detection And Tracking Algorithm For A Wide Band Multichannel Direction-Finding System In The HF Band," Milcom Conference Procedings, 1999.

Dubuc et al., "An Automatic Modulation Recognition Algorithm For Spectrum Monitoring Applications," ICC '99, Jun. 19, 1999.

Shull et al., "Modulation Classification By Wavelet Decomposition Entropy Analysis1," ASME Press, vol. 10, Nov. 15-20, 2000.

Medav, Dr. Hans-Joachim Kolb, "Signal Processing and Neural Networks in Surveillance and Radio Monitoring," Medav, 1993, 20 pgs.

Medav, "Medav OC-6040, PC-Based 4-channel Analyzer And Demodulator For Narrowband COMINT Signals With Automatic Signal Recognition," publication date unknown, 8 pgs.

BBN Technologies, "Using Signal Processing to Analyze Wireless Data Traffic," May 22, 2002, BBN Technical Memorandum No. 1321, prepared for DARPA.

Medav, Dr. Hans-Joachim Kolb "Short Time Spectral Analysis of Audio Signals on a PC," unknown publication date, 6 pgs.

Aglient Technologies, "Verifying Bluetooth™ Baseband Signals Using Mixed-Signal Oscilloscopes," 2001, Application Note 1333-3.

Medav, "Astrid: Analysis System for Telecom Signals, Recognition, Interception and Demodulation of VHF/UHF Radio Signals from 0 to 2 GHz," 2000, 8 pgs.

Gregory P. Noone, "A Neural Approach to Automatic Pulse Repetition Interval Modulation Recognition," 1999, Procedings of Information Decision and Control.

Nolan et al., "Modulation Scheme Recognition Techniques for Software Radio on a General Purpose Platform," unknown publication date, Networks and Telecommunications Research Group, Trinity College.

Medav, "Astrid++: Analysis, Monitoring, Recording and Multi-Channel Direction Finding of Wideband Radio Signals," 2000.

Taira et al., "Automatic Classification of Analogue Modulation Signals by Statistical Parameters," 1999, Milcom Conference Procedings.

Bart Rice et al., "Tutorial -C: Automatic Signal Classification," 1998, EUSIPCO Conference.

Oscor, "Oscor 5000 (Omni-Spectral Correlator)," unknown publication date.

Logicon Company Literature (Northrup Grumman), "Logicon Specific Emitter Identification," unknown publication date.

Boudreau et al., "A Fast Automatic Modulation Recognition Algorithm And Its Implementation In A Spectrum Monitoring Application," Oct. 2000, Milcom.

Ketterer et al., "Classification of Modulation Modes Using Time-Frequency Methods," 1999, IC.

Nolan et al., "Modulation Scheme Classification for 4G Software Radio Wireless Networks," unknown publication date.

* cited by examiner

FIG. 9

| Pulse Start Time | Pulse Center Frequency | Pulse Duration | Pulse Bandwidth | Classification/Identification |
|---|---|---|---|---|
| 0 μs | 2.450 GHz | 7000 μs | 4000 kHz | |
| 0 μs | 2.300 GHz | 400 μs | 1000 kHz | |
| 0 μs | 2.600 GHz | 700 μs | 1000 kHz | |
| 625 μs | 2.500 GHz | 400 μs | 1000 kHz | Possible Bluetooth™ SCO pulse related to 400 μs pulse at time 0 μs |
| 3750 μs | 2.700 GHz | 400 μs | 1000 kHz | Possible Bluetooth™ SCO pulse related to 400 μs pulse at time 0 μs and time 625 μs |
| 4375 μs | 2.200 GHz | 400 μs | 1000 kHz | Possible Bluetooth™ SCO pulse related to 400 μs pulse at time 0 μs, time 625 μs and time 3750 μs |
| 5000 μs | 2.400 GHz | 700 μs | 1000 kHz | Possible cordless phone pulse related to 700 μs pulse at time 0 μs |
| 7500 μs | 2.400 GHz | 400 μs | 1000 kHz | Possible Bluetooth™ SCO pulse related to 400 μs pulse at time 0 μs, time 625 μs, time 3750 μs and time 4375 μs |
| 8125 μs | 2.750 GHz | 400 μs | 1000 kHz | Possible Bluetooth™ SCO pulse related to 400 μs pulse at time 0 μs, time 625 μs, time 3750 μs, time 4375 μs and time 7500 μs |
| 10000 μs | 2.700 GHz | 700 μs | 1000 kHz | Possible Cordless phone pulse related to 700 μs pulse at time 0 μs and at time 5000 μs (Primary Owner: Classifier 2; Secondary Owner: Classifier Z) |
| 11250 μs | 2.250 GHz | 400 μs | 1000 kHz | Possible Bluetooth™ SCO pulse related to 400 μs pulse at time 0 μs, time 625 μs, time 3750 μs, time 4375 μs, time 7500 μs and time 8125 μs |
| 11875 μs | 2.450 GHz | 400 μs | 1000 kHz | ... |
| 15000 μs | 2.650 GHz | 400 μs | 1000 kHz | ... |
| 15000 μs | 2.100 GHz | 700 μs | 1000 kHz | Possible Cordless phone pulse related to 700 μs pulse at time 0 μs, at time 5000 μs and at time 1000 μs (Primary Owner: Classifier 2; Secondary Owner: Classifier Z) |
| 15625 μs | 2.380 GHz | 400 μs | 1000 kHz | ... |
| 16000 μs | 2.450 GHz | 7000 μs | 4000 kHz | Possible microwave oven pulse related to 7000 μs pulse at time 0 μs |

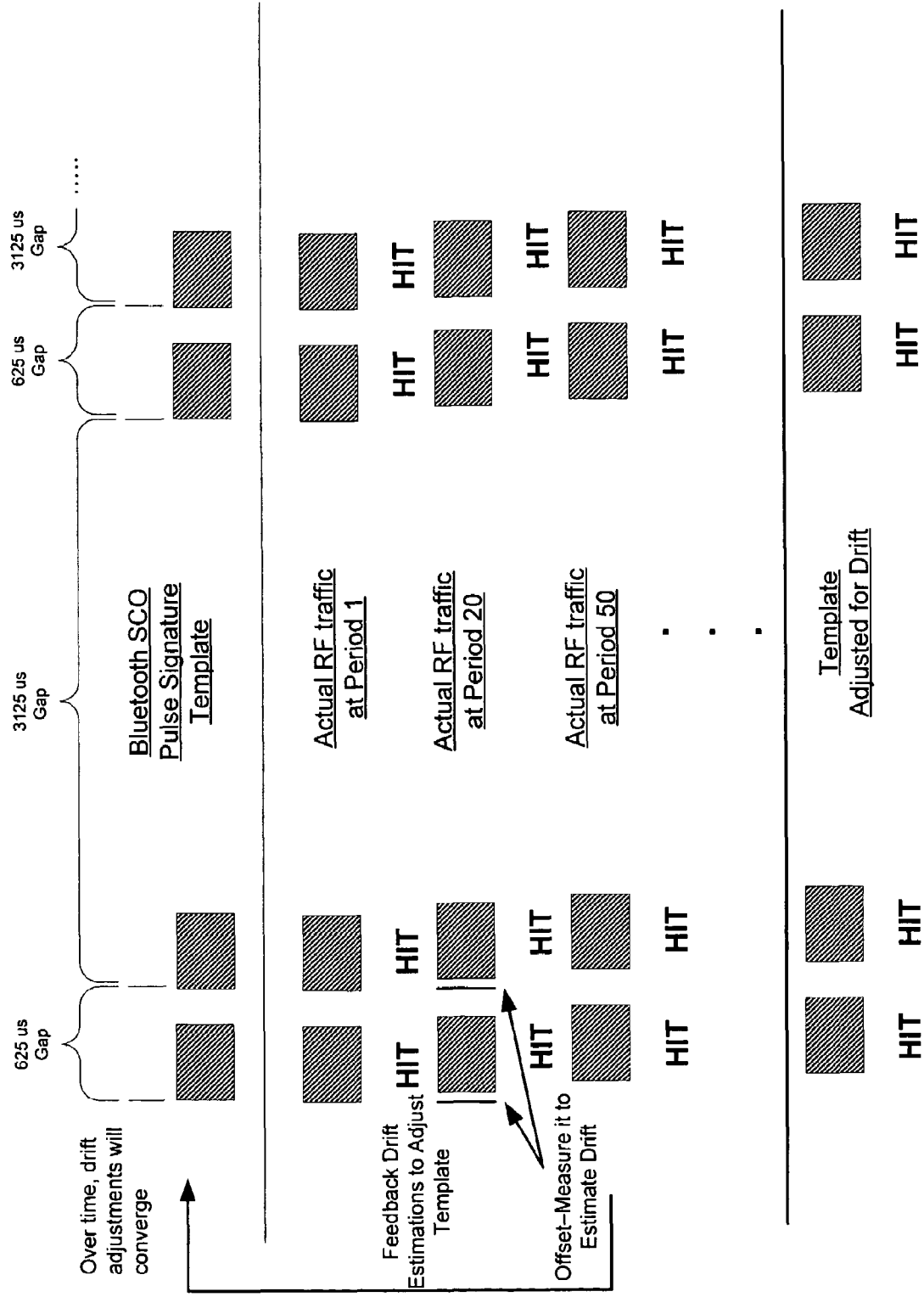

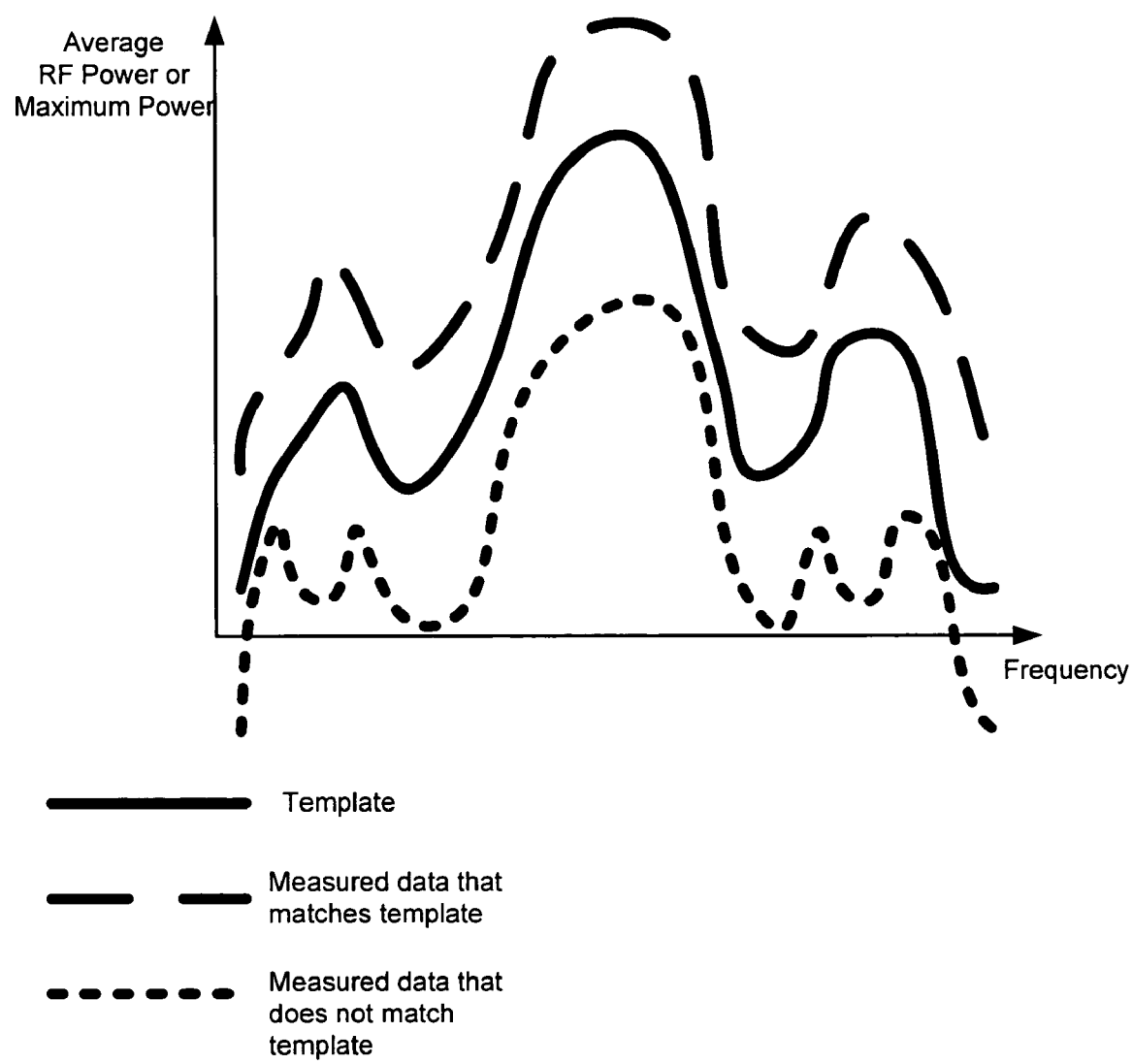

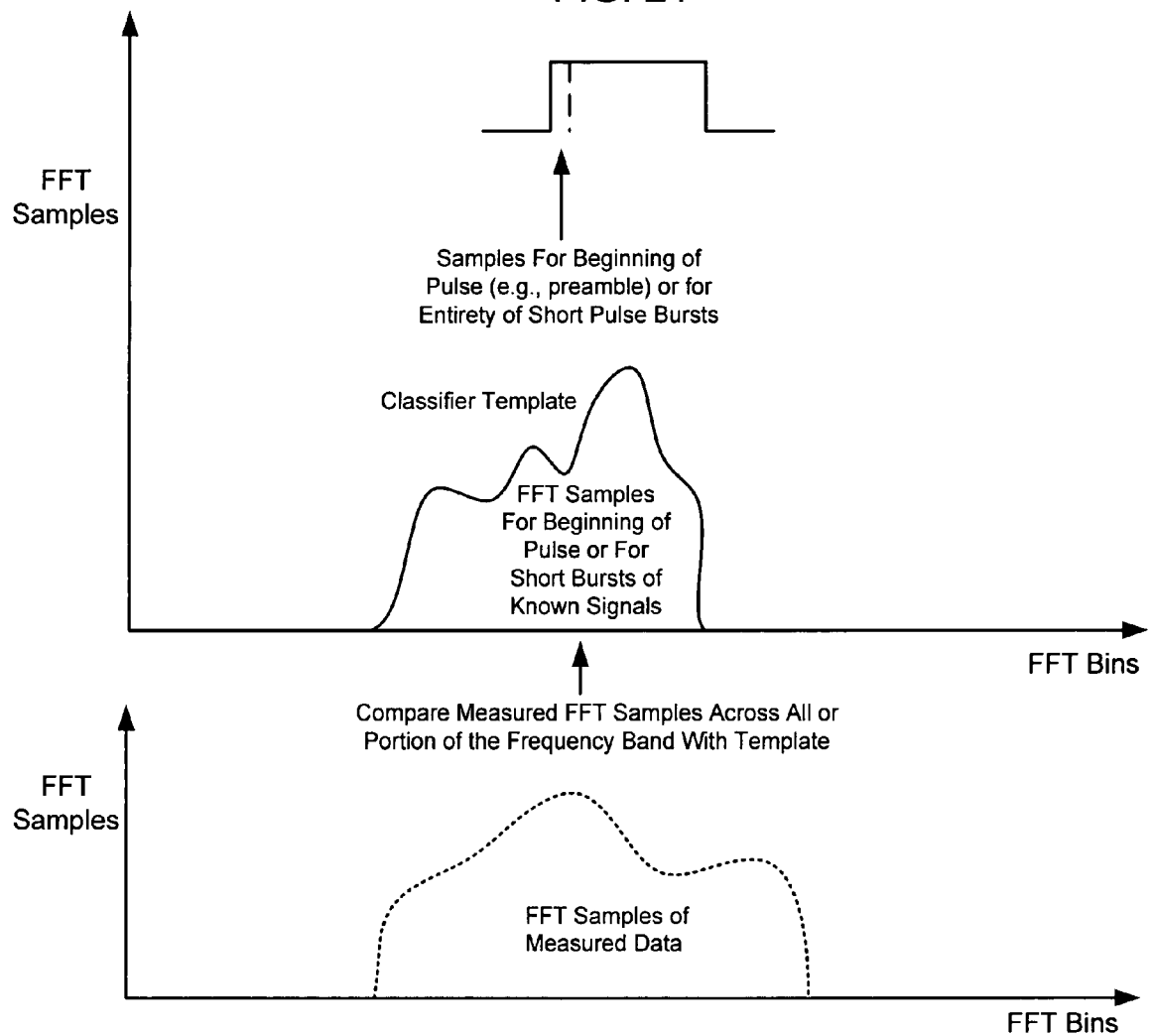

SIGNAL CLASSIFICATION METHODS FOR SCANNING RECEIVER AND OTHER APPLICATIONS

This application claims priority to the following U.S. Provisional Applications (each of which is incorporated herein by reference):

Application No. 60/510,495, filed Oct. 10, 2003.
Application No. 60/481,706, filed Nov. 26, 2003.

This application is related to the following commonly assigned and co-pending U.S. Patent Applications (each of which is incorporated herein by reference):

application Ser. No. 10/246,364, filed Sep. 18, 2002, now U.S. Pat. No. 6,850,735 B2;
application Ser. No. 10/420,362, filed Apr. 22, 2003; and
application Ser. No. 10/628,603, filed Jul. 28, 2003.

This application is also a continuation-in-part of U.S. application Ser. No. 10/628,603, filed Jul. 28, 2003.

BACKGROUND OF THE INVENTION

The present invention is directed to radio communication devices, and more particularly to technology for classifying or identifying signals in a radio frequency band using data derived from received radio frequency energy.

In certain radio communication environments, it is desirable to know whether and what types of signals or devices are active. For example, an unlicensed radio frequency band is, by its nature, free to be used by any device that emits signals within certain power levels in that part of the allocated spectrum. It is possible that many diverse devices may share the unlicensed frequency band at the same time, potentially causing interference with each other. Under these circumstances, it would be useful to identify or classify signals detected in the frequency band in order to know, for example, whether a device should take certain actions to avoid interfering with other devices operating in the frequency band.

SUMMARY OF THE INVENTION

Briefly, a system and method are provided for classifying signals occurring in a frequency band using a plurality of classifier procedures each dedicated to classifying a particular signal or signal type. The classifier procedures operate on spectrum data that may include pulse event data describing particular types of signal pulses occurring in the frequency band, power versus frequency data for sampling intervals of activity in a frequency band and/or raw analog-to-digital converter samples take of a received signal. As an example, the signal classification techniques are useful to identify wireless radio signals or other radio emissions occurring in an unlicensed radio frequency band.

One type of classification procedure is a pulse timing template that is compared against accumulated signal pulse data to determine occurrence of a particular signal type. To enhance the pulse timing template signal classification procedure, techniques are provided to examine the center frequency distribution of signal pulses that match the timing template in order to confirm that certain signal pulses are associated with a particular frequency hopping signal type. This is particularly useful when the accumulated signal pulse data is obtained from a scanning radio receiver that is tuned to different portions/channels of the frequency band in which the frequency hopping signal is expected to hop.

The above and other objects and advantages will become readily apparent when reference is made to the following description taken in conjunction with the accompanying drawings.

BRIEF DESCRIPTION OF THE DRAWINGS

FIG. 9 is a table showing how pulse event data for detected pulses may be assigned "ownership" to one or more classifier algorithms.

FIGS. 16 and 17 depict application of a pulse timing template to signal pulse data, and illustrate the concept of drift between the template and the signal pulse data.

FIGS. 18, 19 and 20 are diagrams showing a classifier that identifies a signal based on its power (average or instantaneous maximum) attributes.

FIG. 21 is a diagram showing a classifier that identifies a signal based on FFT samples obtained for a portion (e.g., preamble) or substantially an entire signal pulse.

DETAILED DESCRIPTION OF THE DRAWINGS

Figure 1:
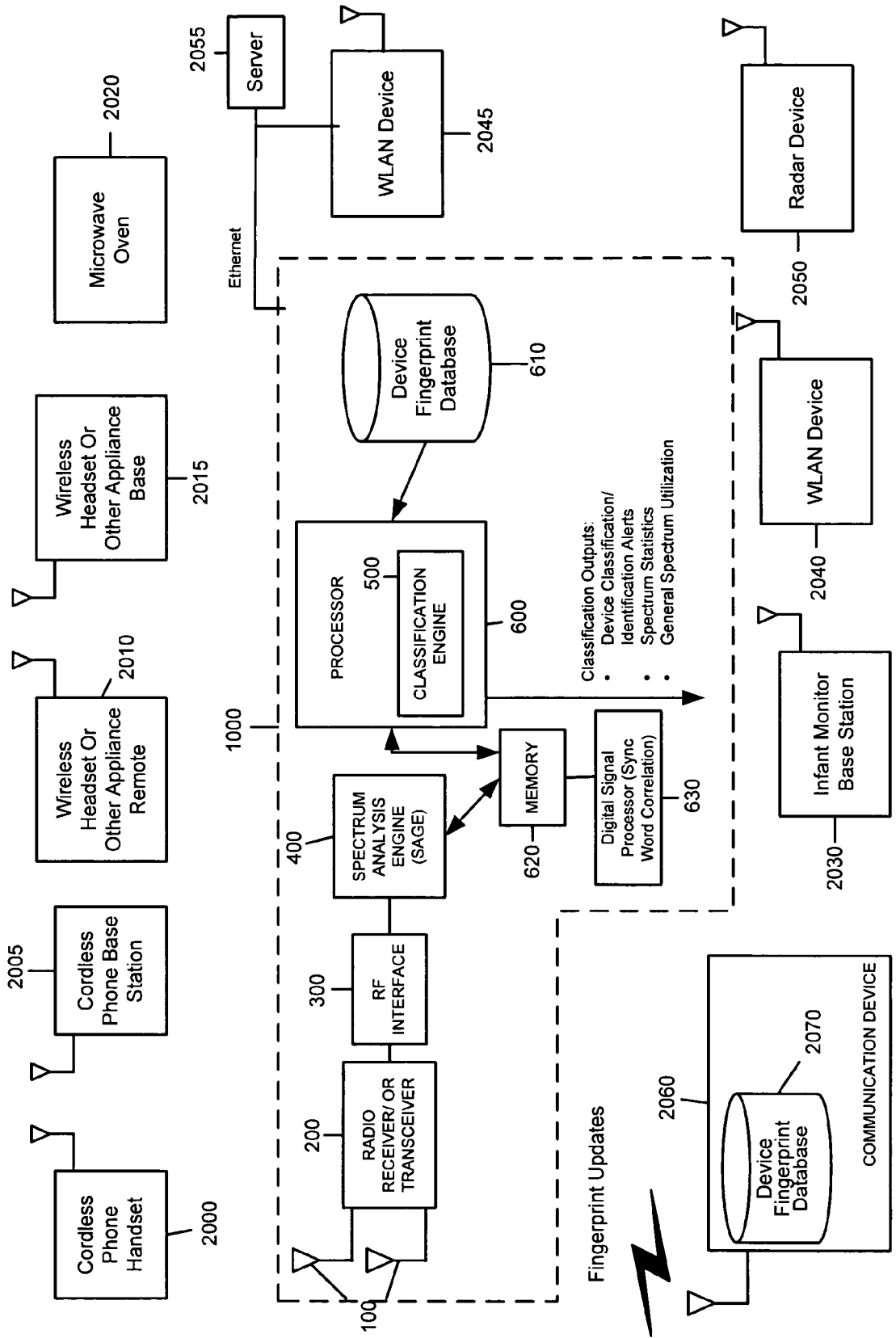
FIG. 1 is a block diagram showing a general environment for a signal classification system and method.

FIG. 1 shows a general environment for a signal classification system and method. A wireless communication device 1000 operates in an environment, such as an unlicensed radio frequency band, where signals of multiples types may be simultaneously occurring. Examples of other devices sharing or emitting energy in the unlicensed frequency band with communication device 1000 are, for example, a cordless phone handset 2000 and cordless phone base station 2005, a wireless headset or other appliance remote 2010 and its base station 2015 (such as a device using the Bluetooth™ protocol), a microwave oven 2020, an infant (video and/or audio) monitor base station 2030, a first wireless local area network (WLAN) device 2040 (such as an access point), a second WLAN device 2045 (such as a station or client) and a radar device 2050. Additional WLAN devices (e.g., stations) may be operating in the frequency band. Device 1000 may be any type of communication device, such as a WLAN device for example. Device 1000 may be in communication, or capable of communicating, with one or both WLAN devices 2040 and 2045. Alternatively, device 1000 may be a sensor device that primarily receives energy in the shared frequency band and does not carry traffic. WLAN device 2045 may be a WLAN AP that is connected to a server 2055 via a wired LAN, e.g., Ethernet. Likewise, the device 1000 may be capable of connecting to the server 2055.

The communication device 1000 has a radio receiver (or transceiver) 200 coupled to one or more antennas 100. An RF interface 300 is coupled to the radio transceiver 200. A spectrum analysis engine (SAGE) 400 is coupled to the radio transceiver 200. The SAGE 400 is a hardware peripheral that generates real-time spectrum activity information. The output of the SAGE 400 is the raw information used in the classification process. The SAGE 400 will be generally described hereinafter with reference to FIG. 2. It should be understood that any device capable of detecting signals in the frequency band and supplying raw information about those signals can be used in a classification process as described herein.

Though not specifically shown, the SAGE 400 may reside in a baseband section of a communication device in a VLSI implementation. A processor 600 executes a classification software program, called the classification engine 500, that may comprise processor readable instructions encoded or stored in a processor readable memory 620. Information used by the classification engine 500 to classify signals may be stored locally in a device fingerprint database 610 (also referred to as a profile or reference database). The concept of a fingerprint will be described hereinafter. In addition, new and updated device fingerprints may be downloaded to the communication device 1000 from another communication device 2060 (or other device) that stores a more comprehensive and updated database 2070 of fingerprint definitions. The processor 600 executing the classification engine 500 may be an on-chip processor in the baseband section, or may be a host processor external to the baseband section, but in the communication device 1000 itself. Alternatively, the classification engine 500 may be executed on another device entirely separate from communication device 1000, in which case communication device 1000 would transmit spectrum information generated by the SAGE 400 via a wireless or wired link to the other device, such as to the server 2055 where the classification engine would be executed. For example, the classification engine 500 could be executed on a server computer that communicates by wire or wirelessly to communication device 1000. Alternatively, if the communication device 1000 is a WLAN station or client, it may transmit the raw spectrum activity information to WLAN device 2045 which may be an access point with greater processing power and capable of overseeing communications in the WLAN. Data output by the SAGE 400 is stored in a memory 620 that the processor 600 accesses when performing the classification operations. The memory 620 may contain the fingerprint database 610 as well.

The communication device 1000 receives radio frequency energy in the frequency band in which it is operating via the radio transceiver 200. The radio transceiver 200 may down-convert the entire frequency band of interest for a given time interval or a portion of it at a given time interval. In addition, the radio transceiver 200 may scan to different portions of the frequency band, stopping to dwell on those portions of a period of time before moving to another portion, thereby gathering information about the entire frequency band. The SAGE 400 processes received energy from the radio transceiver 200 to output first level spectrum information, described hereinafter. The classification engine 500 processes the first level spectrum information with the use of device fingerprints to output information characterizing the activity in the RF spectrum and which classifies/identifies devices operating in the spectrum. When a signal is "classified," data that describes the spectral parameters of the signal are determined sufficiently to know generally what type of signal it is. The parameters may include the bandwidth, center frequency, frequency hopping rate (if it hops), pulse duration, time between pulses, etc. A signal that is classified can also be "identified" such as by the brand of the chipset that transmits its signal, or perhaps so specific as to identify the brand and model of the device that transmits the signal. As a means to confirm a signal classification or identification result, a sync word correlation process may be executed by, for example, a digital signal processor 630. The DSP 630 is capable of invoking a plurality of sync word correlation processes for signals that are expected to be in the frequency band. The DSP 630 would initiate the appropriate sync word correlation after a signal has first been classified based on the spectrum analysis data supplied by the SAGE 400. This sync word correlation process is useful for signals that have distinctive synchronization fields, for example.

Figure 2:
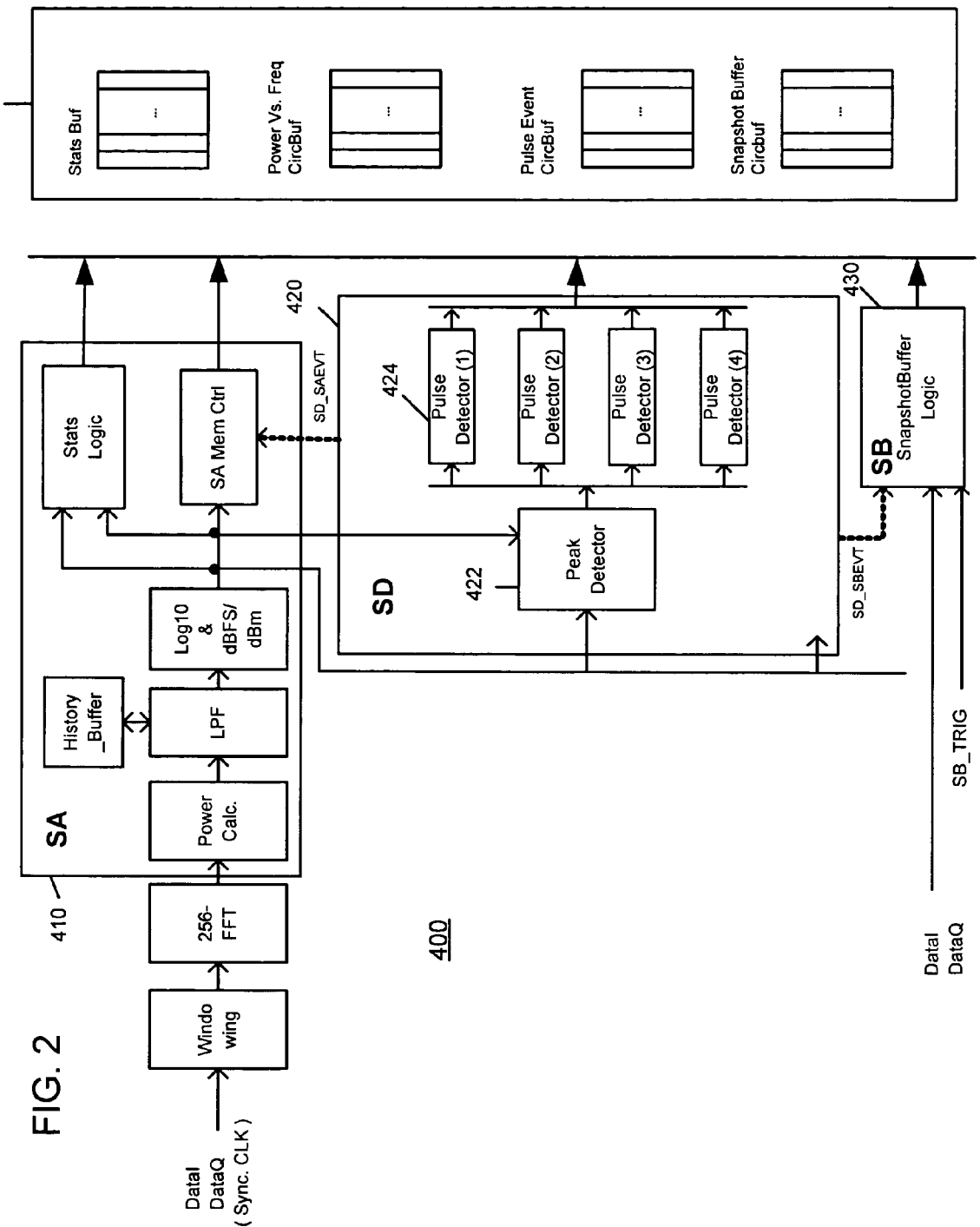
FIG. 2 is a block diagram of an exemplary spectrum analysis component that generates data useful as input to a signal classification process.

With reference to FIG. 2, the SAGE 400 comprises a spectrum analyzer 410, a signal detector 420 and a snapshot buffer 430. The outputs of these components are read out to the memory 620 from a temporary memory 460, which may be a dual port RAM. The processor 600 accesses the output of the SAGE 400 via the memory 620 and controls the SAGE 400 by writing configuration information to the control registers 450 that configures operation of the SAGE components. More details on the SAGE 400 are disclosed in commonly assigned U.S. Pat. No. 6,714,605, entitled "System and Method for Real-Time Spectrum Analysis in a Communication Device," and U.S. application Ser. No. 10/420,511, filed Apr. 22, 2003, the entirety of each of which is incorporated herein by reference. The memory 460 may comprise circular buffers to store data (for a sampling interval or sampling event) output by the various components of the SAGE 400. The processor 600 may have its own working memory (e.g., RAM) from which it reads data from the memory 620 and operates on data in that working memory to perform the signal classification techniques described herein.

Figure 4:
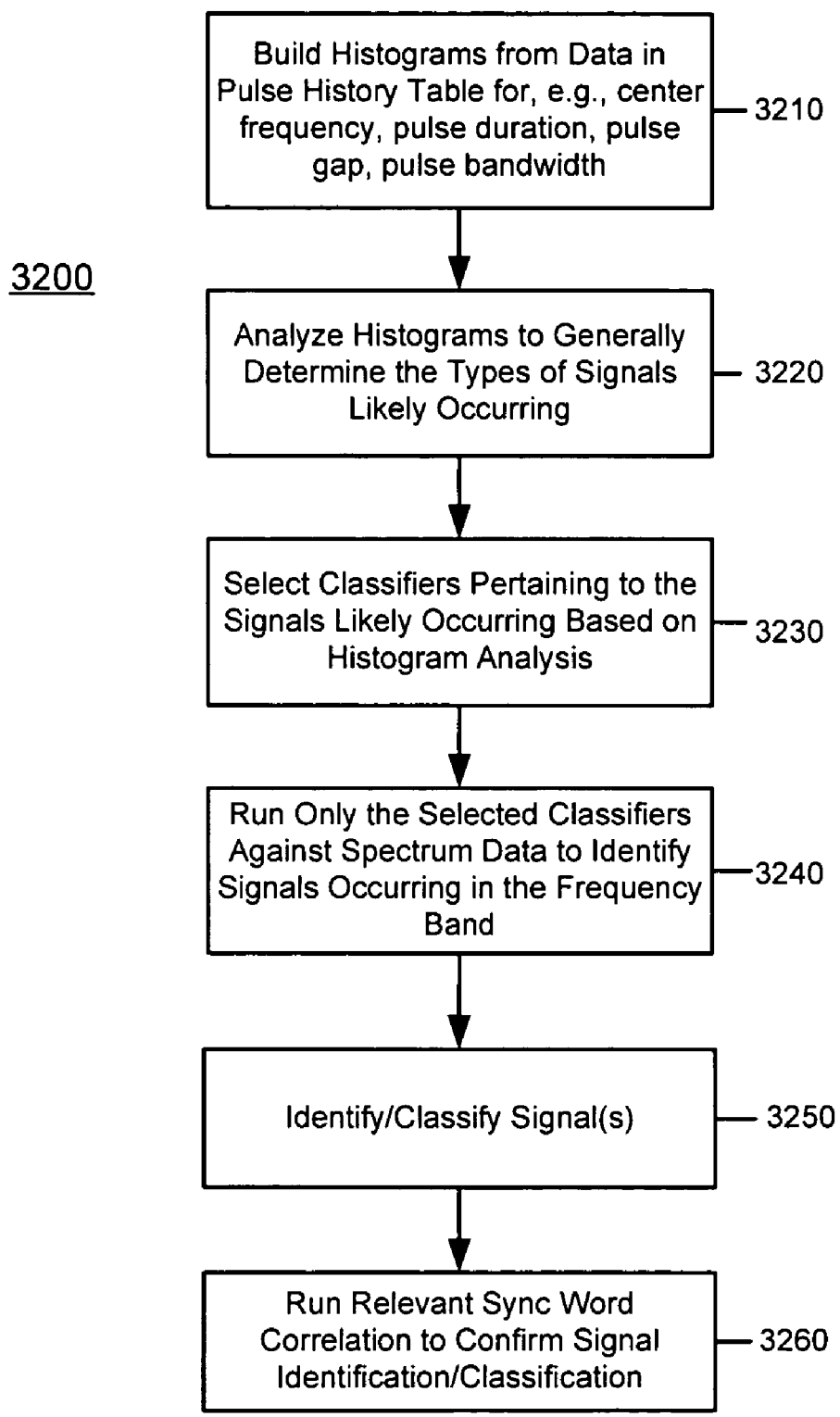
FIG. 4 is a flow chart depicting the various steps of a signal classification process.

As described in the aforementioned U.S. patent, the SA 410 generates data representing a real-time spectrogram of a bandwidth of RF spectrum, such as, for example, up to 100 MHz using a Fast Fourier Transform (FFT) process. As such, the SA 410 may be used to monitor all activity in a frequency band, such as the 2.4 GHz or 5 GHz bands. As shown in FIG. 4, the data path leading into the SA 410 comprises an automatic gain control block (AGC) block, a windowing block, a NFFT=256-point complex FFT block, and a spectrum correction block. The windowing and FFT blocks may support sampling rates as high as 120 Msps (complex). The windowing block performs pre-FFT windowing on the I and Q data using either a Hanning or rectangular window. The FFT block provides (I and Q) FFT data for each of 256 frequency bins that span the bandwidth of frequency band of interest. For each FFT sampling time interval, the FFT block outputs M (such as 10) bits of data for each FFT frequency bin, for example, 256 bins.

Internal to the SA 410 are a lowpass filter (LPF), a linear-to-log converter, a decimator and a statistics block. The LPF performs a unity-gain, single-pole lowpass filtering operation on the power values of the signal at each FFT frequency. The linear-to-log block at the output of the FFT computes the decibel value for each FFT value (in dBFS, i.e., dB from full-scale on the ADC); the decibel value is subsequently converted to an absolute power level (in dBm) by subtracting the receiver gain control from the dBFS value. The stats logic block accumulates and stores the following statistics in the stats buffer of the memory 620: duty cycle vs. frequency during a period of time; average (or running sum of) power vs. frequency during a period of time; maximum (max) power vs. frequency during a period of time; and number of peaks during a period of time. The stats block gives the basic information about other signals surrounding a device operating a SAGE 400. Duty cycle is a running count of the number of times the power at a FFT frequency bin exceeds a power threshold. The max power statistic for each FFT frequency bin is the maximum power at that FFT frequency bin during a sampling interval. The average power statistic is actually tracked as a running sum of the power at each FFT for all FFT intervals, and a software program translates the running sum into an average statistic by accounting for the number of FFT intervals in a single sampling interval. The peaks histogram tracks the number of peaks detected over time intervals. A sampling interval comprises a plurality of FFT intervals, such as 40,000 successive FFTs of (a portion or the entirety) of the frequency band, taken over a total time of 1/10 of a second, for example.

The signal detector 420 comprises a peak detector 422 and one or more configurable pulse detectors 424 coupled to the peak detector. The processor 600 (or another processor coupled to the processor 600, not shown, or another application program) configures the one or more pulse detectors to detect signal pulses that fall within specified ranges of bandwidth, power, center frequency, duration, etc., to detect signal pulses of certain types of signals.

More specifically, the peak detector 422 detects a peak as a set of FFT points in contiguous FFT frequency bins, each above a configured minimum power level. Once per FFT interval, the peak detector 422 outputs data describing those frequency bins that had a FFT value above a peak threshold and which frequency bin of a contiguous set of frequency bins has a maximum value for that set. In addition, the peak detector 422 passes a power vs. frequency bin data field for each FFT interval. The peak detector 422 outputs the bandwidth, center frequency and power for each detected peak.

A pulse detector 424 calculates relative thresholds based on configuration information, and checks whether a peak exceeds the relative thresholds. If a peak exceeds the relative threshold, it defines the peak as a pulse candidate. Once a pulse candidate is found, the pulse detector compares the identified pulse candidate with a pulse definition such as ranges for power, center frequency, bandwidth and duration (defined by the pulse detector configuration information). After matching a pulse candidate with a defined pulse associated with the configuration information, the pulse detector declares that a pulse has been detected and outputs pulse event data (start time, power, center frequency, bandwidth, duration and start time) associated with the detected pulse.

The spectrum analyzer 410 outputs duty cycle statistics such as the percentage of time of energy at each frequency in a frequency band and the average power and maximum power at each frequency (for example, at each of the 256 FFT frequency bins processed by the spectrum analyzer 410). A pulse detector 424 in the signal detector 420 can also be configured by the processor 600 to trigger the snapshot buffer to store raw analog-to-digital (ADC) samples of the received signal when a pulse of a particular type is detected. Other devices or processes may be used to generate raw spectrum information useful by a signal classification process.

In essence, two or more pulse detectors function to simultaneously compare the spectral information with at least two sets of signal pulse characteristics, where each set of signal pulse characteristics comprises ranges for at least one of center frequency, duration and bandwidth of signal pulses, such that pulse data is output for any pulses that meet any one of the sets of signal pulse characteristics.

The SD 420 monitors pulse activity on each of its pulse detectors 424 and sends an SA_SAEVT to the SA 410 when a particular pulse event is detected. This enables the SA 410 to capture power vs. frequency information and spectrum analyzer statistics for a time period following detection of a particular type of signal pulse. Again, this spectrum analyzer data may be useful for signal classification.

The snapshot buffer 430 is a flexible data storage and triggering mechanism used to collect a set of raw ADC samples for post-processing. When a snapshot trigger condition is detected, the SB 430 buffers a set of ADC samples (DataI and DataQ) and asserts an interrupt to a processor, e.g., processor 600. The processor 600 may then perform background-level processing on the ADC samples for the purposes of signal classification. One use of the snapshot buffer function for signal classification is to capture a synchronization word portion of a signal to confirm a classification of identification of that signal using a sync word correlation process implemented, for example, by the digital signal processor 630 shown in FIG. 1.

In a prestore mode, the SB 430 writes continuously to a circular buffer in the memory 620 and stops writing and interrupts the processor when a snapshot trigger signal is detected. In a poststore mode, the write operation begins only after a trigger is detected. SB_DELAYSTART and SB_DELAYEND control signals may be used to create a combination pre and post store scenario. The trigger signal is sourced from either the signal detector 420 (SD_SBEVT) or from a module external to the SAGE 400 (SB_TRIG). A 0-1-0 pulse for one CLK cycle on SD_SBEVT or SB_TRIG signals a snapshot trigger condition to the SB 430.

The snapshot buffer samples may be stored, for example, as two complex samples per 32-bit word. The user may use configure the SB component to perform either a single snapshot buffering operation or to run continuously.

Consequently, the first level spectrum information may include one or more of:

1. Signal pulse data (called pulse events): a list of pulse center frequencies, bandwidths, power, duration and time between pulses, for pulses detected by each of the pulse detectors.

2. Duty cycle statistics.

3. Average power and maximum power at each frequency.

4. Raw analog-to-digital samples of the received energy.

Information used to build or compile a fingerprint definition is obtained from one or more of the following sources:

1. Industry standards or protocols, such as IEEE 802.11, Bluetooth™, IEEE 802.15.3, HomeRF™, etc.
2. Public filings with the U.S. Federal Communications Commission (FCC).
3. Public information from research publications.
4. Lab tests using a spectrum analyzer, duty cycle analyzer and/or vector analyzer.
5. Operation of the SAGE 400 to obtain pulse event duty cycle and spectrum analyzer output information representative of various signals.

Figure 3:
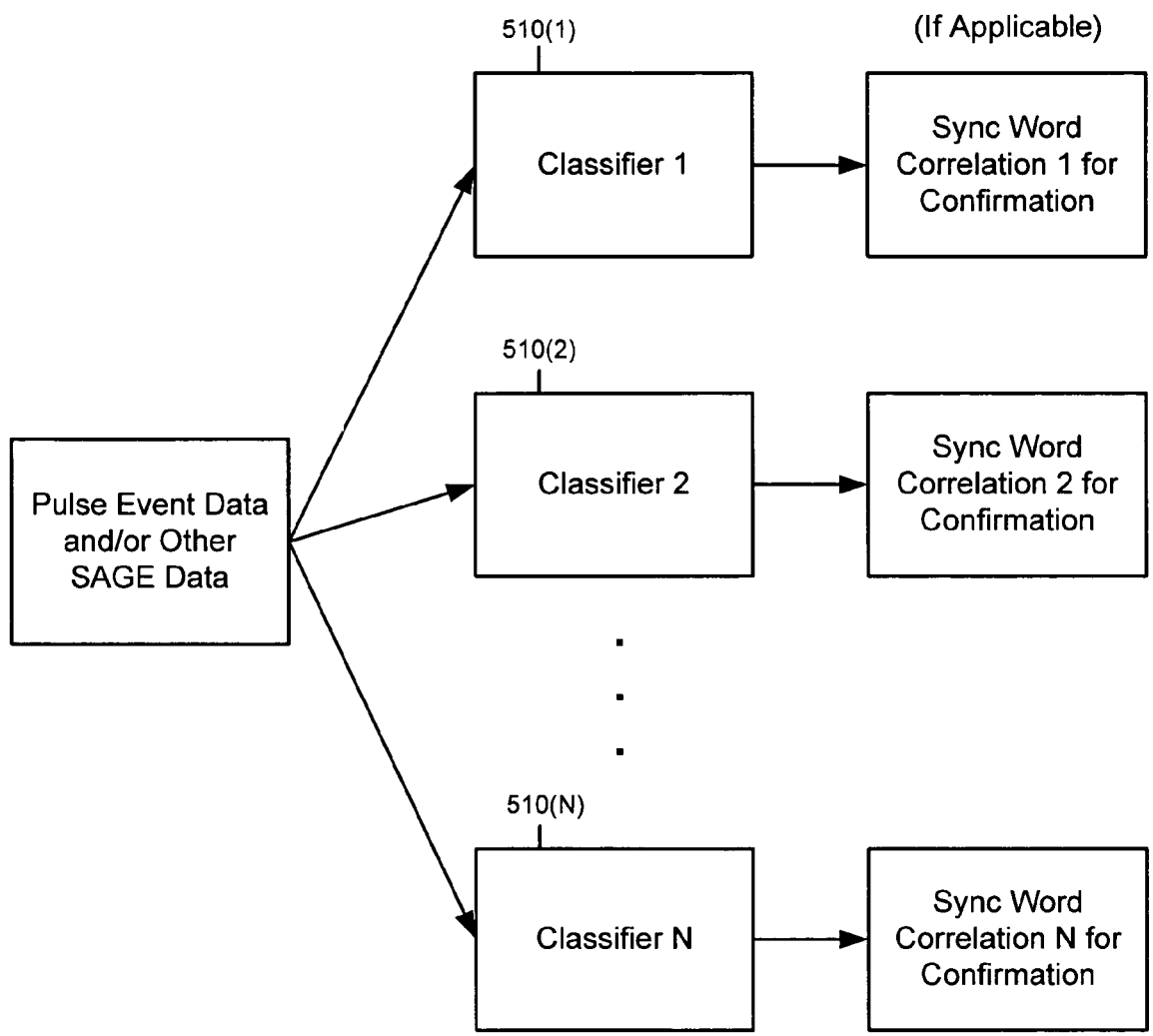
FIG. 3 is a flow chart generally depicting a signal classification process.

Turning to FIGS. 3 and 4, a generalized description of a classification procedure 3200 is provided. This procedure selects a subset of a plurality of classifiers that are relevant to the spectrum activity being observed in the frequency band by the SAGE 400. In step 3210, histograms are built based on output of the SAGE 400 over successive cycles of pulse event data. These histograms provide more general trend information about the pulses of radio frequency energy occurring in the frequency band. Examples of useful histograms are center frequency, pulse duration, time between consecutive pulses (pulse gap), pulse bandwidth, and pulse power. Other useful histograms may include an active transmissions histogram. In addition, histograms for duty cycle, maximum power and average power may be built from the output of the SAGE 400.

In step 3220, the histograms are analyzed to generally determine the type of activity in the frequency band, and thus, the types of signals likely occurring in the frequency band. For example, if the majority of signal pulses have relatively short durations and a center frequency that varies across the frequency, then the signals likely occurring are frequency hopping signal types. On other hand, if the center frequency histogram indicates signals are occurring at one or more frequencies on a consistent basis, and the pulse duration histogram indicates signal pulses of a relatively long duration, then 802.11 or other constant frequency signals may be occurring in the band.

In step 3330, a subset of the plurality of classifiers is selected that most likely pertain to the signals occurring in the frequency band based on the histogram analysis. In step 3340, only those selected (subset of the total) classifiers are run against the spectrum activity information to identify signals occurring in the band, e.g., pulse event data analysis, etc. When a match to a signal type by a classifier occurs, a declaration of an identified/classified signal is made in step 3350. Then, in step 3360, a sync word correlation process for the corresponding signal type is executed to confirm the signal classification as depicted in FIG. 3. Step 3360 may be an optional or unnecessary step for certain signal types.

Figure 5:
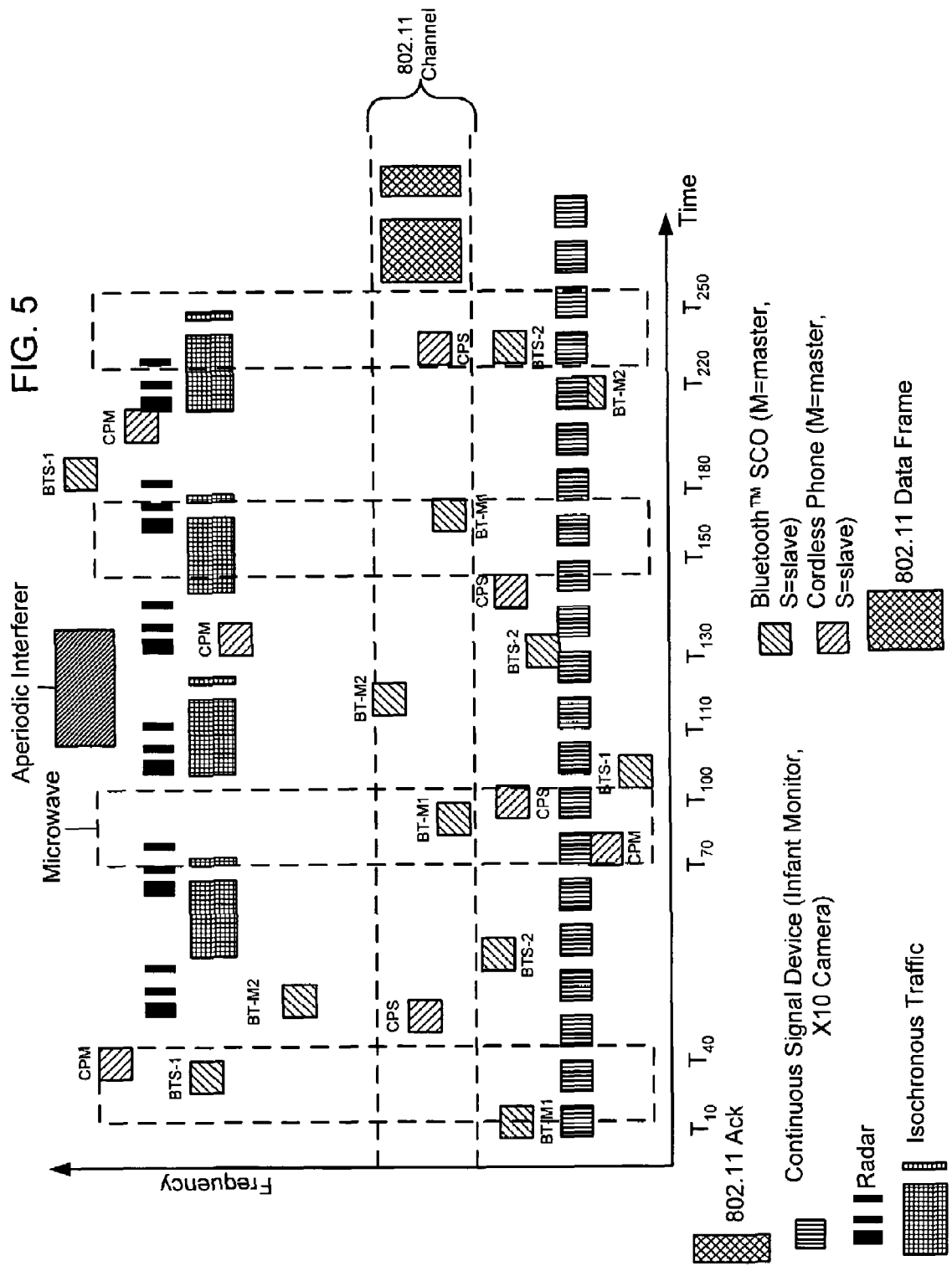
FIG. 5 is a graphical diagram illustrating exemplary signals that may occur in a frequency band and how data related to those signals is accumulated for analysis by the signal classification process.

FIG. 5 is a diagram pictorially representing multiple signals occurring in a shared, e.g., unlicensed, radio frequency band. A legend is shown for the various signal pulses shown. This diagram highlights the capability afforded by the SAGE to detect and track signals of multiple types that may be simultaneously occurring in a frequency band. The SAGE can do this when the radio supplying data to the SAGE is operated in a narrowband mode or wideband mode.

Figure 6:
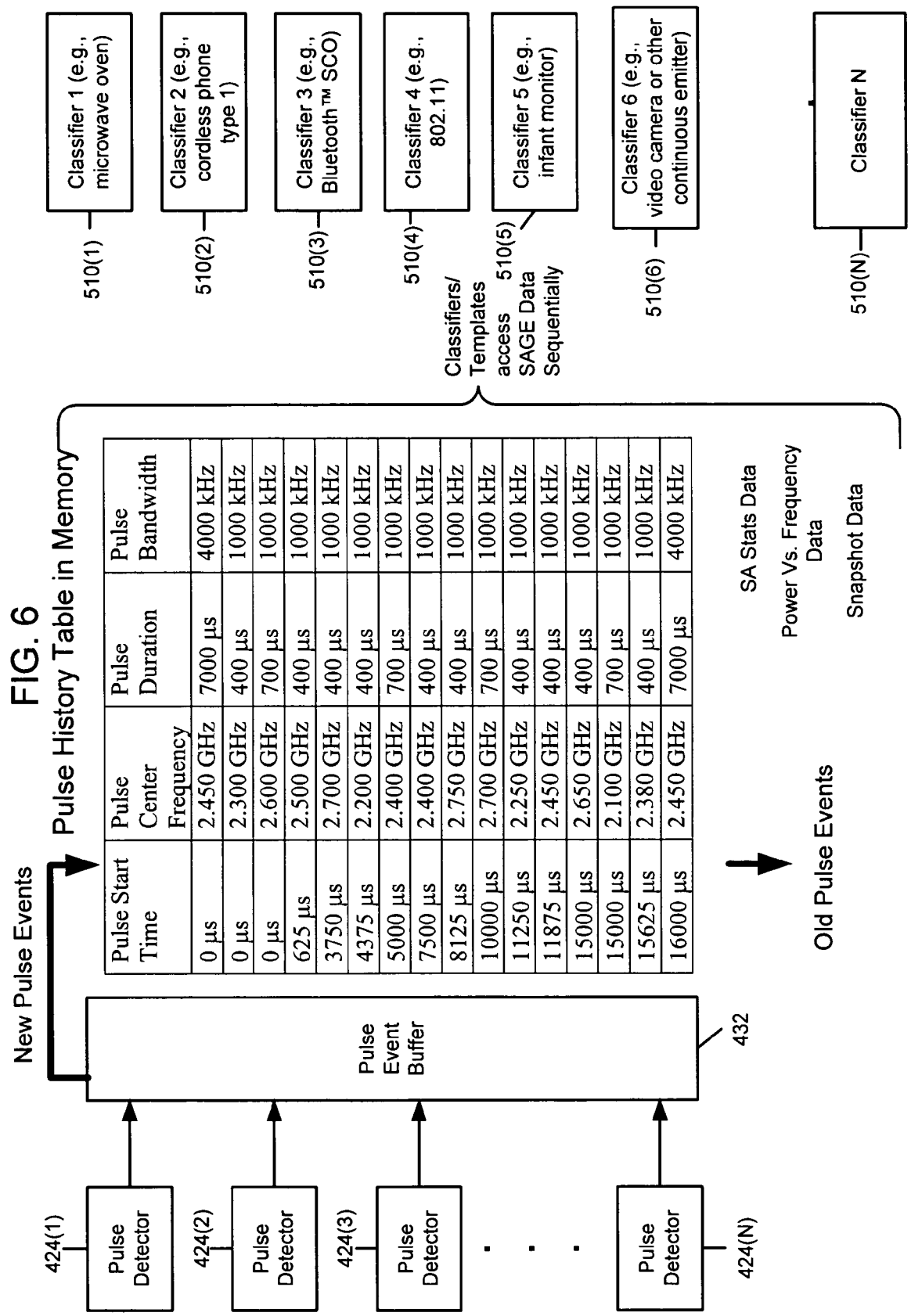
FIG. 6 is a diagram showing how the output of the spectrum analysis component is processed by a plurality of classifiers.

FIG. 6 shows a process by which pulse event data produced by the pulse detectors 424(1) to 424(N) is output into a pulse event buffer memory 432. The pulse event buffer memory 432 is, for example, a circular buffer, and may reside with the SAGE 400 and buffers data for the various components of the SAGE 400, including the pulse detectors, spectrum analyzer and snapshot buffer. The content of the pulse event buffer 432 is read out into a working memory of a processor or other logic that operates on that data for performing signal classification. A data structure referred to as a pulse history table may be produced from the pulse event data, whereby for each pulse detected by a pulse detector, the associated pulse event data is provided, including the center frequency, duration, bandwidth and power (pulse power is not shown in FIG. 6). The pulse event data may not necessarily be loaded in chronological order of occurrence because a pulse detector will not output the data until the pulse is completed. However, the data can be reordered in the pulse history table.

A plurality of classification procedures (also called classifiers) 510(1) through 510(N) some of which operate on the data contained in the pulse history table and others which operate on pulse event data and/or spectrum analyzer stats data including maximum power, sum power, FFT power vs. frequency data and snapshot data. Many types of signals can be identified based on information contained in, or derived from, the pulse history table, while others are better classified/identified using additional or other data. One classifier at a time accesses the data in the pulse history table, as explained hereinafter in connection with FIG. 7. After all of the classifiers which operate on data in the pulse history table have been executed, new pulse event data is read from the pulse event buffer into the pulse history table, and the old pulse event data is moved out of the pulse history table and maybe saved in another memory location for subsequent processing or for archival purposes. Similarly, one classifier at a time accesses the spectrum analyzer statistics data output by the spectrum analyzer that is stored in a suitable working memory. Thus, signal pulse data is accumulated for a series of time intervals and the plurality of classification procedures are executed against the accumulated signal pulse data for each time interval one time interval at a time.

Figure 7:
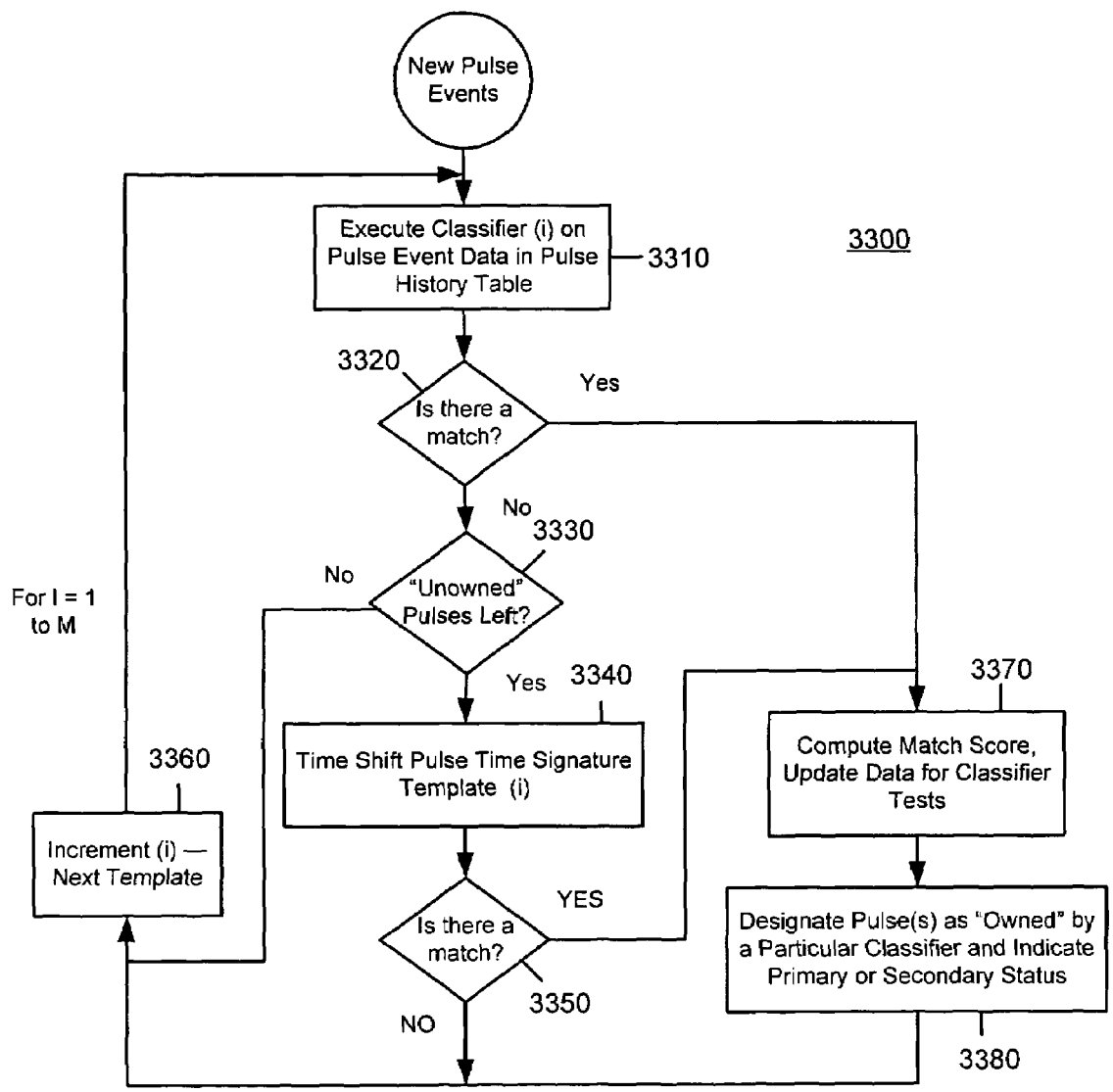
FIG. 7 is a flow chart depicting how pulse event data is processed by a plurality of classifiers.

Referring to FIG. 7, a procedure 3300 is shown in which multiple classifiers operate on pulse event data in the pulse history table. The pulse history table is updated with new pulse events on a periodic basis, for example, for a new time interval of spectrum activity information covering a predetermined period of time. Those classifiers (indicated by classifiers 1 to N in FIG. 6) that operate on the data in the pulse history table are given access to the table on a sequential basis, e.g., one at a time, to execute their analysis against the accumulated signal pulse data in the pulse history table. In step 3310, a first classifier operates on pulse event data in the pulse history table. If the first classifier finds one or more matches in the pulse history table in step 3320, the process jumps to step 3370 described hereinafter. If no match is found, then in step 3330, a determination is made whether there are any pulse events in the pulse history table that have not yet been found to match with (hereinafter said to be "owned" by any classifier). If so, and if the classifier uses a pulse time signature template, then in step 3340, the pulse time signature template is shifted in time (forwards and/or backwards) and compared against the pulse history table to determine whether a match exists against the pulse event data. If a match is found in step 3350, then the process proceeds to step 3370. Otherwise, the next classifier is retrieved in step 3360 and the process of steps 3310–3350 is repeated. When a match is found in steps 3320 or 3340, a match score (how close of a match is it) is computed and a classifier test(s) is/are updated (for that classifier) with the new match data in step 3370. In addition, in step 3380, an identifier for a particular classification procedure is associated with (or designated for) the one or more signal pulses in the accumulated signal pulse data that match the particular classifier, thereby establishing "ownership" of those signal pulses by the corresponding classifier. Moreover, if a strong match confidence score (greater than, e.g., 80%) occurs, then that pulse (or those pulses) may be designated as "primarily owned" by the corresponding classifier, whereas if a lower match confidence score occurs, then that pulse (or those pulses) may be designated as being "secondarily owned" by the corresponding classifier. The index i is incremented to perform the same process with the next classifier. This process is repeated each time the pulse history table is updated with new pulse event data.

As described further hereinafter in conjunction with FIGS. 8 and 9, designating "ownership" of pulses by a classifier (using an identifier as shown in FIG. 9) is also useful in determining multiple (not necessarily related) instances of the same signal type occurring close in time in the frequency band, for example, multiple Bluetooth™ piconets. For example, the Bluetooth™ classifier will recognize, from the ownership designation information associated with pulse events, timing patterns associated with two or more piconets because the timing of one piconet will be out of phase (because it will be positioned in different Bluetooth time slots) from the other(s).

Figure 8:
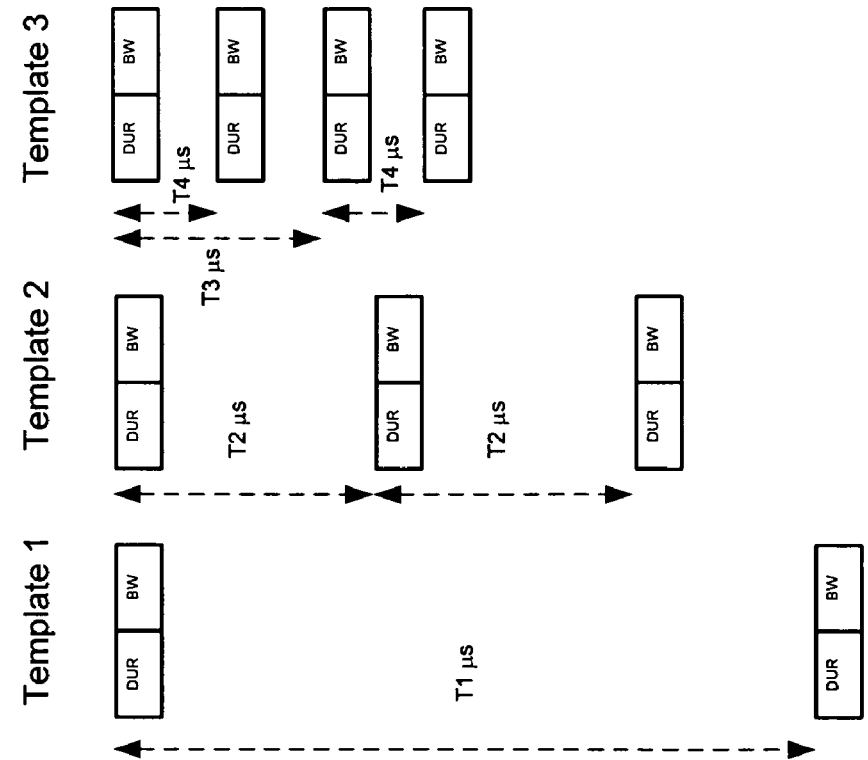
FIG. 8 shows an exemplary pulse history table that stores pulse event data used by the pulse timing template classifiers to classify signals.

FIG. 8 shows how pulse time signature templates are compared against the pulse event data in the pulse history table. For example, one template, template 1, may involve detecting pulses of a particular duration and bandwidth separated in time by T1 μs. For a microwave oven signal, a template similar to template 1 may be sufficient, where the duration and bandwidth ranges of the template are sufficient to capture a pulse 7000 μs long and 4000 kHz wide, repeating every T1=16000 μs.

Template 2 may be designed to detect a 1000 kHz wide and 700 μs long pulse that repeats every T2=5000 μs, where, for example, a first pulse is associated with a cordless phone base unit and the next pulse is associated with the cordless phone hand-set (or vice versa). This may be, for example, a frequency hopping system such as a cordless telephone system. This pattern repeats every 4000 μs and if another cordless phone system of the same type occurs, it will follow the same timing, but offset in time from the other system. Thus, Template 2 can be used to identify more than one cordless phone system of the same type occurring in the frequency band.

Template 3 is representative of a template that is useful to detect a frequency hopping system such as Bluetooth™ SCO signal traffic. Template 3 is designed to detect 1000 kHz wide and 400 μs long pulses that may occur at different frequencies, but with a common timing pattern. The template will detect a pair of pulses occurring, wherein the second pulse of the pair begins T4 μs after the leading edge of the first pulse, followed by a subsequent pair of pulses, the first of which begins T3 μs after the leading edge of the second pulse of the previous pair of pulses. The timing pattern is indicative of a single Bluetooth master-slave piconet, but is also useful for other frequency hopping systems. Other Bluetooth piconets (or other frequency hopping systems) occurring in the frequency band will have a similar timing pattern and Template 3 can be used to detect multiple instances of frequency hopping system, such as multiple and different Bluetooth piconets, occurring closely in time in a frequency band. Template 3 may have rigorous match requirement such that if the second pulse of a pair of pulses does not begin precisely T4 μs after the leading edge of the first pulse, a match is not declared. Furthermore, if the two pairs of pulses are separated such that the time between the leading edge of the second pulse in the previous pair and the leading edge of the first pulse of the subsequent pair by a time period other than T3 μs, a match will not be declared.

The templates are compared against the pulse event entries in the pulse history table to determine if there is alignment with respect to any two or more pulses in the pulse history table. This may involve shifting the templates forward and/or backwards in time in the table to determine if there is an alignment assuming the duration and bandwidth parameters of each pulse also match. In this manner, the pulse time signature templates take into account the time between consecutive pulses. Moreover, by adjusting the timing templates forwards and/or backwards in time when compared against the signal pulse event data in the pulse history table, the occurrence of multiple systems of the same or different types may be detected because the pulse timing patterns of each system (of the same or different type) may be offset, but nevertheless detectable. That is, a timing template is compared against the accumulated signal pulse data multiple iterations, each iteration at a different time offset with respect to the accumulated signal pulse data in order to detect multiple occurrences of the same signal type.

As shown in FIG. 9, classification/identification information may be indicated for each pulse event entry in the pulse history table. The correspondence between other pulses can be identified as well. FIG. 9 also shows that some pulse events may have "primary" and "secondary" ownership information indicated for a corresponding classifier. For example, the pulse event at time 15000 μs may yield a match to a sufficient degree with classifier 2 and some other classifier, designated classifier Z. This could be the case, for example, for a type of cordless phone system that may have pulse characteristics similar to a cordless phone system of another type for which there is another classifier.

The advantage of using multiple classifiers in this manner is that as new devices become available, a new classifier can be added to detect it. Moreover, the pulse characteristic differences between some devices may be subtle enough that one classifier may match to more than one type of pulse event data. The ability to dedicate a separate classifier to certain devices makes it easier to distinguish between otherwise similar devices. Furthermore, accurately identifying, and distinguishing between, signals occurring in the frequency band may be important for security reasons. Certain types of systems operating in a particular region may indicate a security breach or other unauthorized use of the frequency band in an otherwise secure location. A precise signal identification system as described herein can be used to alert a network administrator of potential security breaches.

Figure 10:
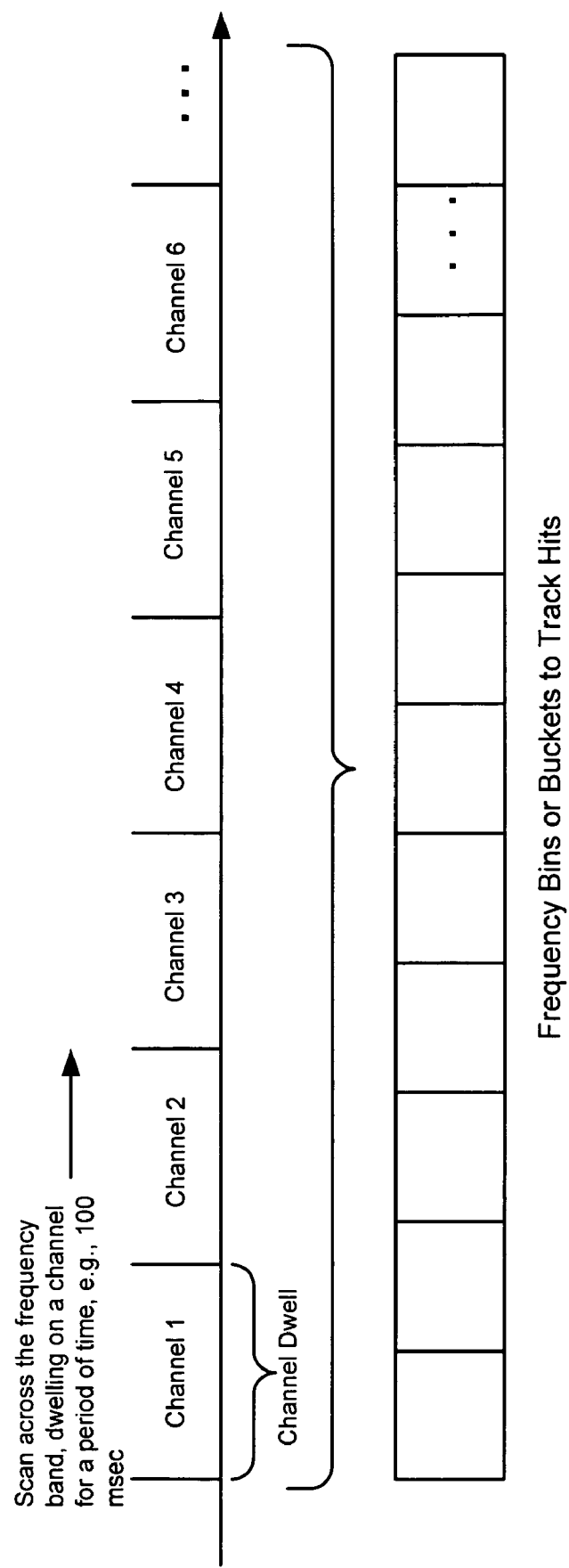
FIG. 10 is a diagram showing how a radio receiver may be scanned across a frequency band, dwelling on a channel or portion of the frequency band for a period of time during which spectral analysis is performed.
Figure 11:
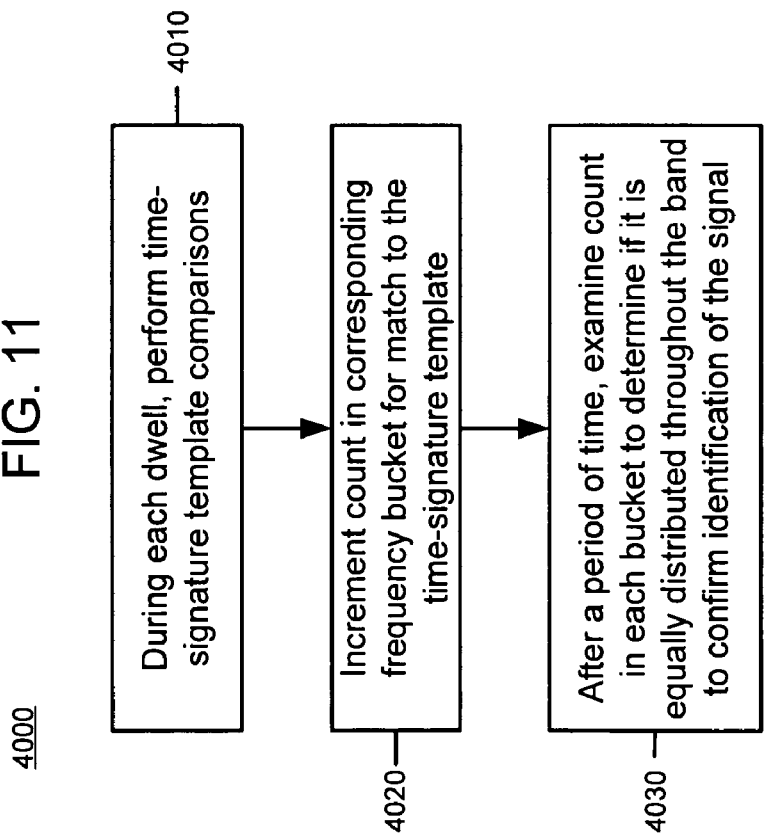
FIG. 11 is a flow chart depicting a pulse timing template classification process that operates on data obtained by a scanning radio receiver as depicted in FIG. 10.

Referring first to FIGS. 10 and 11, a technique is described for building information regarding the center frequency distribution of matches to a classification test, such as a pulse signature timing template. Some devices that operate in a shared radio frequency band, e.g., an unlicensed band, use a frequency hopping protocol that hops in a pseudo-random fashion throughout a frequency band, such as Bluetooth™ and other cordless phone devices. These systems follow a very rigid pulse timing template. Moreover, for Bluetooth™ devices, the pseudo-random frequency hopping pattern is generally equally distributed across at least a portion of the 2.4 GHz unlicensed frequency band.

The process 4000 involves gathering the spectrum information using a radio receiver that is scanned across the frequency band. In step 4010, the receiver stops to dwell on a channel for a period of time and for the spectrum information gathered during that dwell, a classifier is executed, such as a pulse timing template classifier. In step 4020, each time a match to the pulse timing template is made, the corresponding center frequency bucket in which the match occurred is noted and a hit count for that bucket is incremented. In step 4030, after a period of time (or a sufficient number of total hits are accumulated), the number of hits in the frequency buckets is used to determine if the number of hits across the frequency band is sufficiently (e.g., evenly) distributed. For example, the average hits per bin and a standard deviation is computed. If the standard deviation exceeds a threshold, then the center frequency distribution analysis denies an overall match to a signal as, for example, a Bluetooth™ signal, because the data did not reflect the necessary even center frequency distribution of hits. By contrast, if the standard deviation is less than the threshold, then the center frequency distribution analysis is useful to confirm the overall match to a Bluetooth™ signal, for example. It should be understood that the center frequency distribution analysis is useful to filter out false positives. That is, it is used on top of, or in addition to, the pulse timing template tests to verify that the signal matching the pulse timing templates really is a frequency hopper of the particular variety, such as Bluetooth™.

To summarize the technique depicted by FIGS. 10 and 11, a method is provided for verifying the presence of a signal in a radio frequency band, comprising steps of comparing pulse event data derived from radio frequency energy received in the frequency band with a pulse timing template defining time between consecutive pulses; tracking the center frequencies of pulse events that are determined to match the pulse timing template; over time, examining a distribution of the center frequencies for pulse events determined to match the pulse timing template; and declaring a classification match to the known signal type when the distribution of center frequencies for matches to the pulse timing template are consistent with the center frequency distribution of the known signal type.

Figure 12:
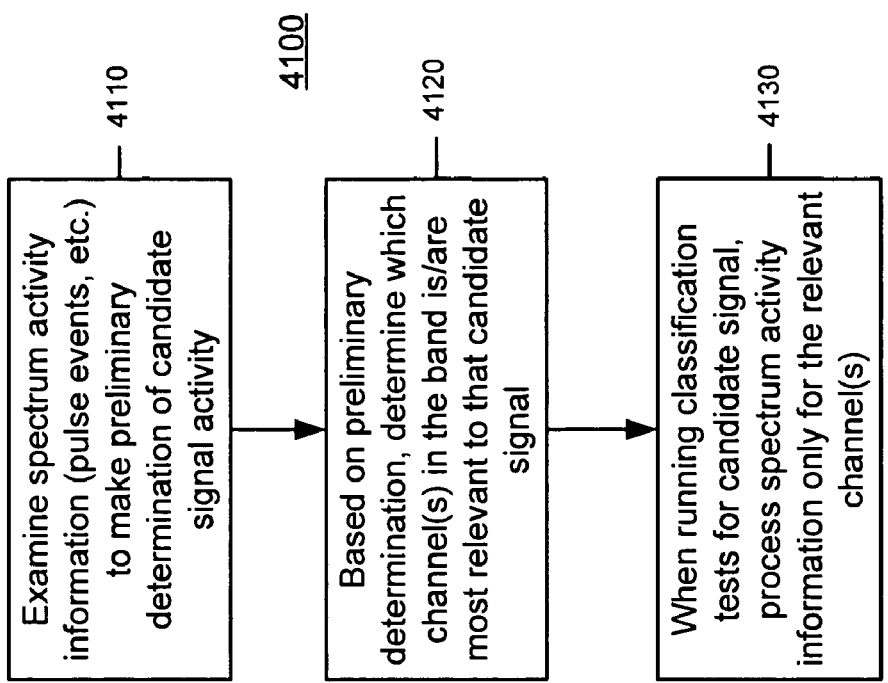
FIG. 12 is a flow chart depicting how a classifier is run only against data obtained for a relevant portion of the frequency band.

With reference to FIGS. 10 and 12, a process 4100 is described that is useful to increase the performance and speed when classifying certain types of signals using a scanning radio receiver. Some signals, such as microwave oven emissions, are known to occur in only a portion of the 2.4 GHz unlicensed frequency band. In step 4110, spectrum activity information is gathered while the radio is scanned across the frequency band and that information is examined to make a preliminary determination of the presence of certain types of signals. In step 4120, a further determination is made as to which channel or channels in the band are most relevant to the candidate signal types determined in step 4120 based on knowledge of the spectral properties of the candidate signals. Next, in step 4130, the classification tests are applied with a set of match requirements or expectation percentages for data obtained when the radio receiver is tuned to those relevant channels, whereas the classification tests are not applied for data obtained when the radio receiver is tuned to channels that are not relevant to that signal type.

To summarize the technique depicted by FIG. 12, a method is provided for analyzing data derived from received radio frequency energy in a frequency band obtained from a radio receiver that scans across the radio frequency band, comprising steps of examining the data derived from received radio frequency energy; making a preliminary determination of the presence of a particular signal occurring in the frequency band; and applying a classification procedure for the particular signal against data obtained while a radio receiver is tuned to only those portions of the radio frequency band in which the particular signal is known to typically occur.

Figure 13:
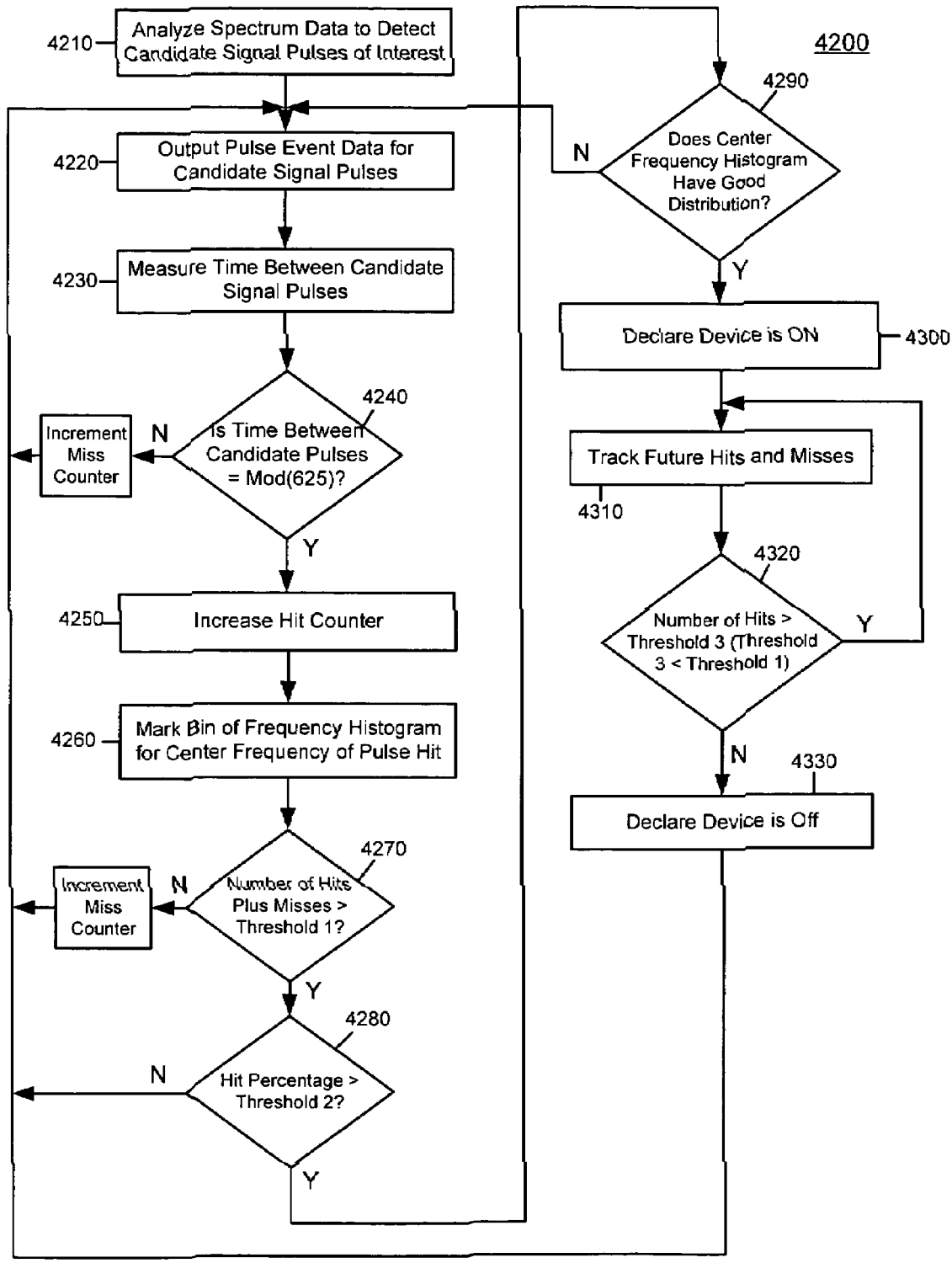
FIG. 13 is a flow chart for a classification algorithm using pulse timing template analysis and center frequency distribution analysis.

FIG. 13 is a flow chart that depicts a classification procedure that uses distribution of center frequency coupled with pulse time signature template analysis that is particularly useful for identifying Bluetooth™ ACL traffic. One or more pulse detectors are configured to output pulse event data for signal pulses that fit the general profile for Bluetooth ACL pulse traffic, relatively narrow bandwidth pulses of potentially longer duration than Bluetooth SCO traffic. The flow chart and pulse detector data below assumes that the radio receiver of the sampling device is a scanning receiver, but the algorithm may be applicable to data derived from a wideband receiver. Bluetooth ACL traffic may occur in any Bluetooth slot and, unlike SCO traffic, may occupy multiple 3 or 5 adjacent slots. A pulse detector is configured with the following parameters, for example:

| | |
|---|---|
| Min Power = −85 dBm | Min Duration = 165 usecs |
| Max Power = 0 dBm | Max Duration = 3125 usecs |
| Power Hold = 3 dB | Min Center Freq = 2402 KHz |
| Min Bandwidth = 350 KHz | Max Center Freq = 2480 KHz |
| Max Bandwidth = 1 MHz | Center Freq Hold = 500 KHz |
| Bandwidth Threshold = 6 dBm | |
| Bandwidth Hold = 500 KHz | |

The classification algorithm 4200 operates as follows. In step 4210, the pulse detector processes data output by the peak detector to analyze spectrum data and in step 4220 outputs pulse event data (center frequency, bandwidth, duration, power, time of occurrence) for candidate signal pulses that fit the parameters described above that are configured for the pulse detector.

In step 4230, the time between candidate pulses is measured. In step 4240, the time between pulses is compared with a value that represents the typical time between Bluetooth ACL pulses, i.e., mod(625 μsecs) plus or minus a timing error allowance. If the time between candidate pulses is equal to this value, then the process continues to step 4250, otherwise it increments a "miss" counter and returns to step 4220. Step 4250 increments a "hit" counter that tracks the number of candidate pulses that meet the condition of step 4240. Next, in step 4260, a bin is marked in a center frequency histogram corresponding to the center frequency of the candidate pulse that was determined to meet the condition in step 4240. The frequency histogram keeps track of the distribution across possible center frequencies of the pulses that are counted as a hit.

In step 4270, the number of accumulated hits plus misses is compared to a threshold, called Threshold 1 (the sample set size). Threshold 1 is set to be a value that has been determined to reasonably ensure that a sufficient number of samples have occurred to validate the likely occurrence of ACL traffic. For example, Threshold 1 may be 45. If the Threshold 1 is not exceeded in step 4270, then the process returns to step 4220 after the miss counter is incremented. On the other hand, when the number of samples (hits plus misses) exceeds Threshold 1, a hit percentage is computed and compared with another threshold, called Threshold 2. For example, the number of hits that have accumulated in step 4250 is compared against the sample set size output in step 4220 for some period of time. If the hit percentage does not exceed Threshold 2, the process returns to step 4220. When the hit percentage exceeds Threshold 2, then the process continues to step 4290.

In step 4290, the frequency histogram is examined to determine whether the "hit" pulses have a reasonably good distribution across the various possible frequencies for Bluetooth ACL traffic. This test helps to filter out other pulses that otherwise satisfy the criteria of the prior steps, but do not hop across various center frequencies with a desired distribution. If the frequency histogram does not have the desired distribution, then the process returns to step 4220. When the frequency histogram has the desired distribution, then the process continues to step 4300 in which a Bluetooth ACL device is declared to be ON.

After a declaration is made that a Bluetooth ACL device is ON in step 4300, in step 4320 the algorithm continues to track the number of hits and misses and so long as the number of hits exceeds another lesser threshold, called Threshold 3, and these hits meet the desired center frequency distribution, then the device is still considered to be ON. If the number of hits drops lower than Threshold 3 or they do not meet the desired center frequency distribution, then the device is considered OFF in step 4330, and the process restarts from step 4220.

Some further modifications that are useful to prevent false positive detections may be made in connection with steps 4230 and 4250. Specifically, if in step 4230 it is determined that the time between two candidate pulses is greater than a threshold (even though it could subsequently pass the test of step 4240), then all stale events (older than the time threshold) are discarded. In addition, prior to step 4250, if the time between the previous pulse hit and the current pulse hit is greater than a threshold, then the hit counter is not incremented and all stale events (older than the time threshold) are discarded. When returning to step 4220 the oldest pulse events are discarded as appropriate in order to maintain a maximum sample set size of Threshold 1.

Figure 14:
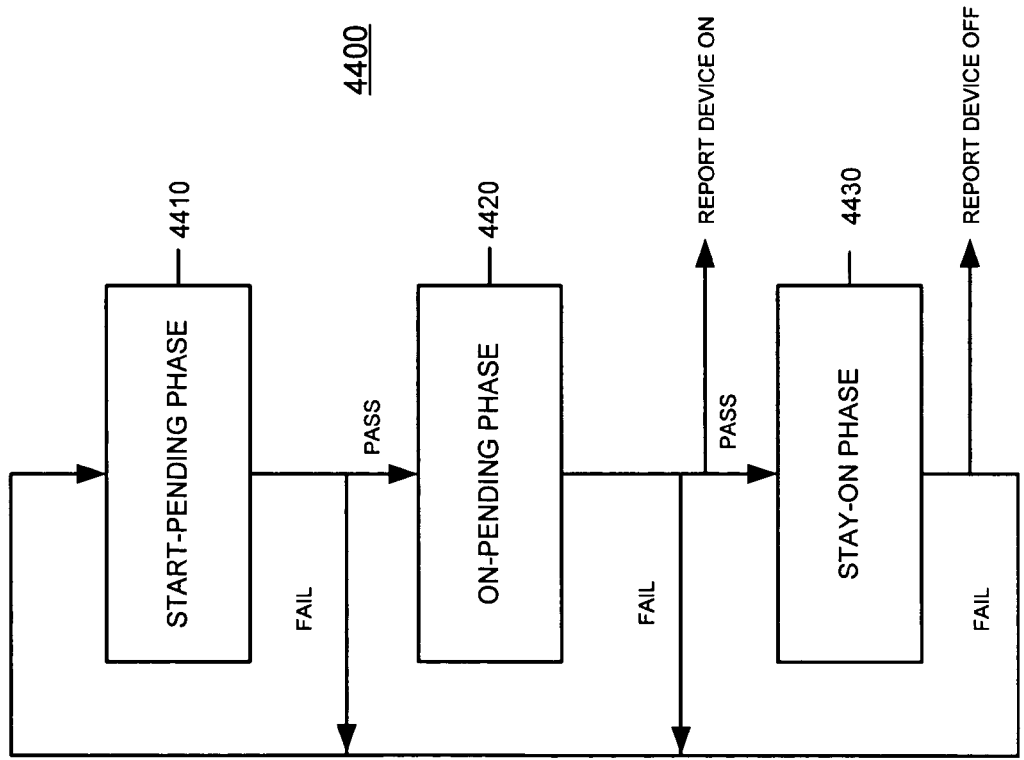

With reference to FIG. 14, an enhanced process 4400 that is useful for identifying/classifying signals using pulse signature templates is described. It is a variation on the concepts depicted in FIG. 13. This process comprises 3 phases: a START-PENDING phase 4410, an ON-PENDING PHASE 4420 and a STAY-ON phase 4430. In the START-PENDING phase 4410, a comparison is made of the pulse signature template against the pulse event data to detect a "start signature" associated with a particular signal type. A "start signature" may be a limited number of pulses, such as less than or equal to 4, which all match the template in order to establish a "start signature" to a particular signal type.

In the ON-PENDING phase 4420, the next (first) N1 number of pulses are checked to determine if there is at least a certain percentage of hits. If this test passes, then the process continues to the STAY-ON phase 4430, otherwise, it returns to the START-PENDING phase.

During the STAY-ON phase, a rolling total of at least a (second) N2 number of pulses are checked to ensure that the hit percentage stays above a minimum level. This is a rolling procedure because each time the hit percentage exceeds the threshold for the N2 number of pulses, the process stays in the STAY-ON state and examines the next N2 number of pulses. If the test in the STAY-ON phase fails, then the process returns to the START-PENDING phase 4410. A variation for the STAY-ON phase 4430 is to periodically check for the "start signature" from the STAY-ON phase, and if the pulse event data does not pass the "start signature" test within N3 seconds, it is declared that the signal is OFF and the process returns to the START-PENDING phase 4410.

Figure 15:
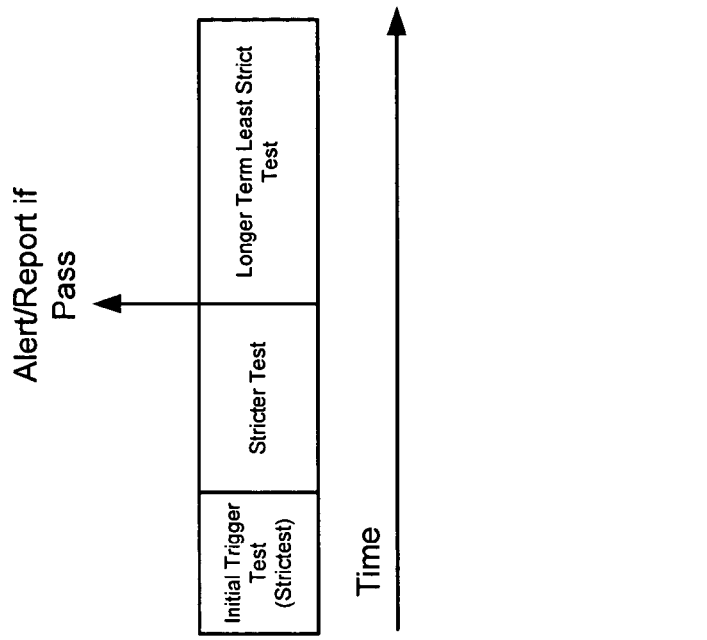
FIGS. 14 and 15 are diagrams showing how test or matching requirements for a classifier may begin initially strict and then may be relaxed over time as confirmation of an occurrence of a signal is made.

FIG. 15 depicts how for each classifier, there may be two or more test criteria (not necessarily limited to characteristics of a pulse time signature template classifier) that are made before an actual declaration is made that a signal of a particular type is occurring in the frequency band. This involves tracking the number of matches and misses of signal pulses with respect to signal pulses that are expected to occur. For example, for some classifiers and classification situations, an initial trigger test may be used whereby for a relative low number of expected successive pulse matches (spanning a relatively short period of time), a very high percentage of those expected pulses must be found to match. If, after the defined number of pulses have occurred, the threshold is not achieved, then the initial trigger test fails, and it is run anew. For example, an initial trigger test may require that 80% of 10 successive pulses (that should match) must match. If the initial trigger test passes, then a second test of medium strictness (called the "stricter test") is applied, whereby a somewhat lower percentage of a relatively greater number of pulses must match. For example, a stricter test may require that 60% of the next 40 expected pulses must match. In any event, once the stricter test is passed, an alert and/or report is made that a signal of a particular type is occurring in the frequency band. This alert/report will continue to be valid until the longer term least strict test fails, at which time the alert/report may indicate that that signal has terminated. To summarize, the results of the signal pulse data comparisons are made with respect to test requirements that are initially relatively more rigorous to provide initial indications that a corresponding particular signal is occurring and become less rigorous after the initial indications are met. The more rigorous testing requirements may involve a first threshold that requires a greater number of matches of signal pulses with respect to a timing template. Subsequently a second threshold is used after the first threshold has been met or exceeded, in which the second threshold requires a lesser number of matches. Thus, the second threshold is less rigorous than the first. A declaration that the corresponding particular signal is occurring may be made only after the second threshold is achieved or exceeded, or alternatively, after the first threshold is achieved or exceeded. For some classifiers, the stricter test is not applied until and unless the initial trigger test is satisfied, while for other classifiers, there is no initial trigger test.

Figure 16:
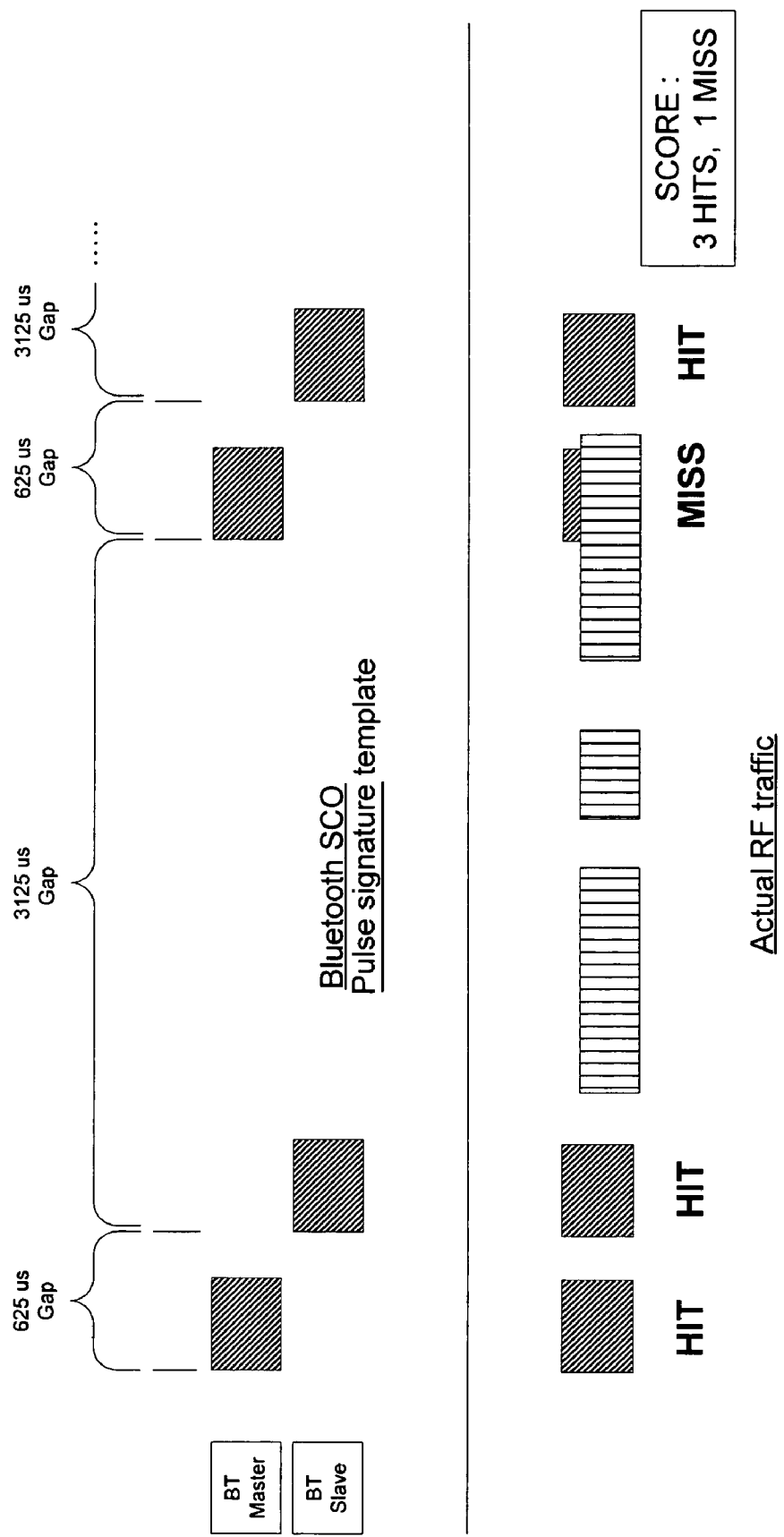

FIG. 16 shows, in still another form, how a pulse signature template designed to classify a Bluetooth™ SCO signal traffic is compared against actual pulse event data. In the example shown, the match score is 3 hits and one miss of the pulse event data with respect to the template. A suitable pulse signature template definition is shown below for a Bluetooth™ SCO signal using a wideband radio that provides received signal data for substantially the entire band in which the signal hops:

Pulse Gaps: 625, 3125 μsecs.
Pulse Bandwidth Range: min 100 kHz and max 2500 kHz
Pulse Duration Range: min 200 μsec and max 600 μsec
Pulse Hit Timing Variance: 120 μsec
Device ON Tests: 10 tests, 65% hits
Device STAY ON Tests: 25 tests/period, 35% hits
Device ON/OFF Debounce Timeout: 1000 msec
Device Inactivity (OFF) Timeout: 1000 msec The initial phase, referred to as the ON phase, searches for a match of 65% hits across 10 pulses of the template. When a match is found to this test, it is declared that a Bluetooth™ SCO device is ON and the STAY-ON phase begins. During the STAY-ON phase, the template is compared and the results tested for a match of at least 35% hits across 25 possible pulses. If the hit rate is less than 25%, the device is declared to be OFF and the debounce timeout begins. If there is no further match activity during the next 1000 msec, then the device is said to be OFF and the process restarts with the initial ON phase.

An enhancement for the STAY-ON phase is to apply techniques to compensate for drifts over time between the pulse event data and a pulse signature template. The drift compensation technique is described hereinafter with reference to FIG. 17. There is drift in the clocks of the devices transmitting the signals to be classified and the device that is receiving the radio frequency energy used for performing the signal classification. It is possible that the pulse event data of a signal that has been correctly identified will over time be missed (or an OFF condition will be falsely triggered) because the time offset caused by the drift will go beyond the tolerances of the pulse signature template. Accordingly, it may be desirable to adjust the template to account for the drift. Drift compensation may be applied during, for example, the STAY-ON state.

As shown in FIG. 17, adjustment of the template may be made by measuring, over time, the offset of the pulse events with respect to the template. Using the measured offset and knowledge of the drift (e.g., 20 PPM) of the device in which the SAGE component is operating, a drift amount can be estimated, e.g., x number of μsec/sec. The estimated drift is fed back to adjust the template to account for the drift. The adjustments for the drift are made over time to avoid missing pulses that are otherwise consistent with the previously detected and classified/identified signal. The amount of the drift should converge as it is estimated, similar to operation of a phase locked loop. Clock drift is generally linear with respect to time. For example, if the estimated clock drift is 6 μs per second and the template was 4 seconds off from when the device was first identified, the (pulse occurrences in the) template would be shifted (advanced or delayed) by 24 μs (6 μs/sec*4 seconds). This type of shift of the template to account for the drift continues into the future.

Turning to FIG. 18, another type of classifier is shown. This classifier is a power template, such as an average power or maximum power template, and it operates on the average power or maximum power versus frequency data output by the spectrum analyzer stats logic block of the SAGE. The average power template describes average power versus frequency characteristics (in a plurality of FFT frequency bins, for example) for a relevant time interval and across a relevant bandwidth for a particular signal to be identified. Likewise, the maximum power template describes maximum power versus frequency characteristics (in a plurality of FFT frequency bins) for a relevant time interval and across a relevant bandwidth for a particular signal to be identified. For example, as shown in FIG. 18, for a particular signal or signal type, there is a corresponding known average power or maximum power profile (shape) and can be used as a template to compare against similar data derived from received radio frequency energy in the frequency band. This power template analysis is also referred to as waveform/waveshape analysis, and average or maximum power templates are useful to identify certain signals that are on constantly, or otherwise have large duty cycles. FIG. 18 shows the average power (or maximum power) profile for two signals one that matches a power template, and one that does not.

Figure 20:
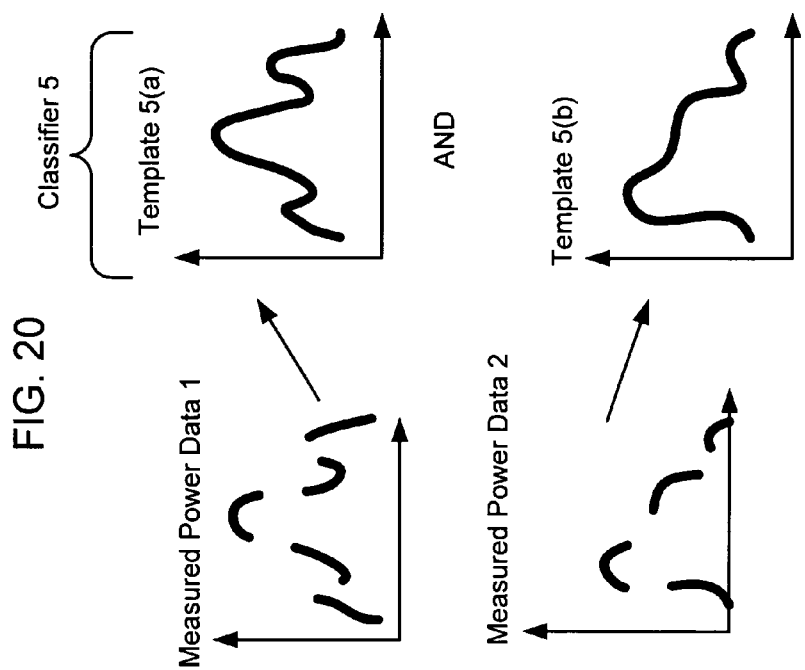
Figure 19:
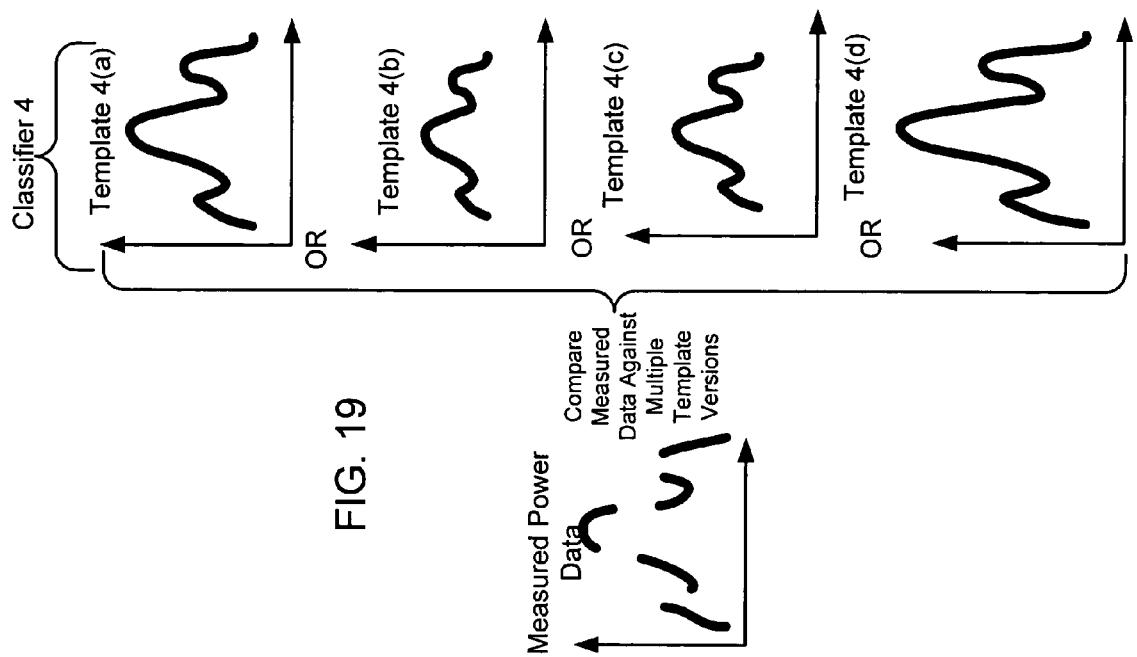

FIGS. 19 and 20 illustrate ways in which these power templates may be used. In FIG. 19, for a particular classifier, several power (either average or maximum) templates are defined to account for different antenna orientations of the source device or of the receive device, that may affect the power profile. The measured power data is compared against each of the templates, and if a match occurs to any one of them, an overall match is declared. A match may be declared if, for example, the standard deviation between the measured data and the template is less than a threshold. The classifier may require that there be a match to any one of the templates during each of several chronologically related (e.g., consecutive) time intervals of power versus frequency data.

FIG. 20 illustrates another use of a power template as a classifier, where the power profile must match each of multiple templates for multiple sampling events. For example, for some signals or signal types, the average or maximum power profile will take on more than one shape during each of two or more active intervals due to the nature of the communication protocol or other requirement of that system. Therefore, a classifier may consist of multiple power templates each of which must have a match over two or more active intervals of that signal. For example, during one active time period of a signal, the measured data may look like measured power data 1, and then during another active time period, the measured power data may look like measured power data 2. If measured power data 1 matches one of the templates and measured power data 2 matches the other of the templates (during another time interval), then a classifier match is declared. Thus, in the process of FIG. 20, there must be a match to all of the power templates over multiple chronological related (e.g., consecutive) time intervals for an indication of a match to be declared, and in particular that there may be a match to a different one of the plurality of power templates during each of the multiple time intervals. Moreover, it may be required that there be a match to power templates in a particular time sequence, e.g., to a first particular power template during a first time interval, a second particular power template during a second time interval, etc.

FIG. 21 shows still another classification procedure where a classifier template consists of raw FFT samples (output by the spectrum analyzer of the SAGE) collected during sampling intervals associated with the beginning portion of a signal pulse, or for the duration of short pulse bursts. A template of the FFT samples for known signals can be used to compare against collected FFT samples of time intervals of FFT data collected by the spectrum analyzer component of the SAGE. Using data from the pulse detectors to signify the beginning of a pulse of a particular type, the snapshot buffer feature of the spectrum analyzer can be used to collect FFT samples for a predetermined number of time intervals that span a sufficient portion of the beginning of the signal pulse to encompass, for example, a signal preamble. The classifier template is compared against the samples. The shape of the classifier template is compared with the shape of the FFT samples, and a measure of deviation can be generated to determine if there is a match. When this technique is applied to the beginning portion of certain signals, it may be useful to identify a signal and/or to distinguish a signal from other signal types having otherwise similar characteristics.

Moreover, this technique can be used for substantially the entire duration of very short pulses, or bursts, where classifier templates for such short pulse signals are stored and compared against FFT samples of measured data to identify a short pulse type of signal. An example of such a short pulse or burst type signal is a type of radar, as well as an 802.11 ACK frame.

A variation of the techniques shown in FIG. 21 can be applied to the snapshot buffer portion of the SAGE, where raw baseband modulated (e.g., I and Q) digital samples (for the beginning portion of signals, or the duration of short pulse signals) are captured and modulated data classifier templates of known signals are compared against the captured digital samples.

In sum, several methods are provided, any of which can also be embodied by instructions encoded on a processor readable medium that, when executed, cause a processor to perform the corresponding steps.

A method is provided for classifying signals occurring in a frequency band, comprising steps of generating data for one or more attributes of radio frequency energy received in the frequency band over time; and executing against the data a plurality of classification procedures to classify signals occurring in the frequency band, wherein each classification procedure is associated with a particular signal type. Similarly, a processor readable medium encoded with instructions that, when executed by a processor, cause the processor to classify signals occurring in a frequency band, comprising a step of executing against data for one or more attributes for radio frequency energy a plurality of classification procedures each of which is dedicated to identifying a particular signal occurring in a frequency band.

A method is provided for classifying signals occurring in a frequency band, comprising steps of: comparing a pulse timing template defining a period between at least two signal pulses against data representing signal pulses detected in the frequency band and declaring that a particular signal is occurring when a percentage of matches to the pulse timing template occur over a first time interval exceed a first threshold; subsequent to the step of declaring, continuing to compare the pulse timing template against the data over a second time interval; and declaring termination of the particular signal when a percentage of matches to the pulse signature template over the second time interval do not exceed a second threshold, and otherwise continuing to maintain that the particular signal is occurring, wherein the first threshold is greater than the second threshold.

A method is provided for adjusting a timing template that defines at least one time period between at least two signal pulses of a signal to be classified based on data representing signal pulses occurring in a radio frequency band, the method comprising steps of estimating the drift between the signal and the template; and adjusting the template by an amount based on the estimate to account for drift over time between the template and the signal that has been determined to match the template.

A method is provided for classifying signals occurring in a radio frequency band comprising steps of: accumulating over time signal pulse data for signal pulses detected in the frequency band, wherein the accumulated signal pulse data comprises the start time, center frequency, bandwidth and duration for each detected signal pulse; executing a classification procedure against the accumulated signal pulse data, wherein the classification procedure compares comparing against the accumulated signal pulse data a timing template describing at least one time period between signal pulses that satisfy defined ranges for bandwidth, duration and center frequency, to determine whether a particular signal is occurring in the frequency band; and designating for one or more signal pulses in the accumulated signal pulse data an identifier associated with the classification procedure when a match is determined with respect to the one or more signal pulses, thereby tracking which signal pulses in the accumulated signal pulse data are associated with a match to the particular signal.

A method is provided for determining occurrence of a signal in a radio frequency band comprising steps of: comparing pulse event data derived from radio frequency energy received in the frequency band with a pulse timing template defining time between consecutive signal pulses of a known type; tracking the center frequencies of pulse events that are determined to match the pulse timing template; over time, examining a distribution of the center frequencies for pulse events determined to match the pulse timing template; and declaring a match to the known signal type when the distribution of center frequencies for matches to the pulse timing template are consistent with the center frequency distribution of the known signal type.

A method is provided for classifying signals occurring in a radio frequency band, comprising steps of: generating data derived from received radio frequency energy in a frequency band when a radio receiver is scanned across the radio frequency band and dwells for a period of time at portions of the frequency band; examining the data derived from received radio frequency energy; preliminarily determining occurrence of a particular signal type in the frequency band based on the data; and applying a classification procedure for the particular signal against data obtained when a radio receiver is tuned to only those portions of the radio frequency band in which the particular signal type is known to occur.

A method is provided for classifying signals occurring in a radio frequency band, comprising steps of: generating power versus frequency data derived from received radio frequency energy in the radio frequency band; and comparing a power template describing power versus frequency characteristics for a particular signal against the power versus frequency data derived from the received radio frequency energy to determine whether the particular signal is occurring in the radio frequency band.

A method is provided for classifying signals occurring in a radio frequency band, comprising steps of: accumulating over time signal pulse data for signal pulses detected in the frequency band, wherein the accumulated signal pulse data comprises the start time, center frequency, bandwidth and duration for each detected signal pulse; and executing a classification procedure against the accumulated signal pulse data, wherein the classification procedure compares against the accumulated signal pulse data a timing template describing at least one time period between signal pulses that satisfy defined ranges of at least one or bandwidth, duration and center frequency, to determine whether multiple instances of the same signal type are occurring in the frequency band.

The above description is intended by way of example only.

What is claimed is:

1. A method for classifying signals occurring in a frequency band, comprising:
  a. generating signal pulse data by computing spectral information representing the radio frequency energy and comparing the spectral information with a set of signal pulse characteristics that comprises ranges for center frequency, duration and bandwidth, to produce signal pulse data for pulses that meet the set of signal pulse characteristics;
  b. accumulating over a time interval signal pulse data for signal pulses detected in the frequency band, wherein the accumulated signal pulse data comprises the start time, center frequency, bandwidth and duration for each detected signal pulse; and
  c. executing against the signal pulse data a plurality of classification procedures to classify signals occurring in the frequency band, wherein each classification procedure is associated with a particular signal type.

2. The method of claim 1, wherein the step of executing comprises executing each of the plurality of the classification procedures against the accumulated signal pulse data.

3. The method of claim 2, and further comprising the step of designating for one or more signal pulses in the accumulated signal pulse data an identifier corresponding to the classification procedure that achieves a match to the one or more signal pulses.

4. The method of claim 2, wherein the step of executing each of the plurality of classification procedures comprises determining multiple instances of the same signal type.

5. The method of claim 1, wherein the step of accumulating comprises accumulating signal pulse data for a plurality of time intervals, and wherein the step of executing comprises executing each of the plurality of classification procedures against the accumulated signal pulse data for each time interval, one time interval at a time.

6. The method of claim 5, wherein the step of executing comprises executing a classification procedure that compares a timing template describing at least one time period between signal pulses that satisfy defined ranges of bandwidth, duration and center frequency against the accumulated data to classify a particular signal occurring in the frequency band.

7. The method of claim 6, and further comprising the step of tracking the number of matches and misses of signal pulses with respect to the timing template.

8. The method of claim 7, and further comprising the step of declaring that a particular signal is classified when the number of matches of signal pulses with respect to a timing template achieves a first threshold and subsequently determining that the number of matches of signal pulses with respect to the timing template achieves a second threshold, wherein the second threshold is less rigorous than the first threshold.

9. The method of claim 8, wherein the step of generating data comprises generating data for received radio frequency energy as a receiver is scanned across the frequency band and dwells at a particular frequency channel for a period of time.

10. The method of claim 6, and further comprising the step of tracking the center frequency of each signal pulse that satisfies the timing template.

11. The method of claim 10, and further comprising the step of analyzing a distribution of center frequency for signal pulses that satisfy the timing template in order for the classification procedure to declare a match.

12. The method of claim 11, wherein one of the plurality of classification procedures comprises a timing template that analyzes signal pulse data to determine occurrence of Bluetooth™ ACL signals.

13. The method of claim 6, and further comprising the step of adjusting the timing template to account for drift over time between the template and the signal pulses that have been determined to match the template.

14. The method of claim 13, and further comprising the step of estimating the drift between the signal pulses and the template.

15. The method of claim 1, and further comprising the step of accumulating one or more histograms from the accumulated signal pulse data that represent trends over time for the center frequency, bandwidth, duration and time between signal pulses detected in the frequency band.

16. The method of claim 15, wherein the step of accumulating one or more histograms comprises building one or more histograms selected from the group consisting of: a center frequency histogram that tracks a percentage of time a given center frequency was observed for detected signal pulses, a bandwidth histogram that tracks the percentage of time a given bandwidth was observed for detected signal pulses, a pulse duration histogram that tracks a percentage of time a given duration or durations was observed for detected signal pulses, a time between pulses histogram that tracks a percentage of time that a given time duration or durations was observed between signal pulses and a number of active transmissions histogram that tracks when several different signal pulses simultaneously occur.

17. The method of claim 15, and further comprising the step of selecting a subset of the plurality of classification procedures that correspond to signals that are likely occurring in the frequency band based on the histograms, and wherein the step of executing comprises executing the subset of plurality of classification procedures against the data.

18. The method of claim 1, wherein the step of generating data comprises capturing baseband modulated digital samples associated with received radio frequency energy.

19. The method of claim 18, wherein the step of executing comprises executing a classification procedure that compares a template of baseband modulated digital samples for a portion of a signal pulse for a known signal against the captured baseband modulated digital samples.

20. A method for classifying signals occurring in a frequency band, comprising:
 a. generating data for one or more attributes of radio frequency energy received in the frequency band over time;
 b. executing against the data a plurality of classification procedures to classify signals occurring in the frequency band, wherein each classification procedure is associated with a particular signal type; and
 c. wherein the step of executing comprises executing a classification procedure that compares a power template describing power versus frequency characteristics against power versus frequency data derived from the received radio frequency energy to classify a signal occurring in the frequency band.

21. The method of claim 20, wherein the step of executing comprises executing a classification procedure that compares each of a plurality of power templates describing power versus frequency characteristics against the power versus frequency data, wherein a particular signal is declared to be occurring when the power versus frequency data matches any one of the plurality of power templates.

22. The method of claim 20, wherein the step of executing comprises executing a classification procedure that compares each of the plurality of power templates against power versus frequency data for multiple sampling intervals, and wherein the particular signal is determined to be occurring when the power versus frequency data matches at least one of the plurality of power templates for each of a predetermined number of time intervals of power versus frequency data.

23. The method of claim 20, wherein the step of executing comprises executing a classification procedure that compares each of a plurality of power templates against power versus frequency data for multiple time intervals, and wherein the particular signal is determined to be occurring when the power versus frequency data matches all of the power templates over the multiple time intervals.

24. The method of claim 23, wherein the step of executing comprises executing a classification procedure that requires a match to a different one of the plurality of power templates during each of the multiple time intervals.

25. The method of claim 20, wherein the step of executing a classification procedure comprises comparing a power template describing average power versus frequency characteristics against average power versus frequency data for a time interval derived from the radio frequency energy occurring in the frequency band.

26. The method of claim 20, wherein the step of executing comprises comparing a power template describing maximum power versus frequency characteristics against maximum power versus frequency data for a time interval derived from the radio frequency energy occurring in the frequency band.

27. The method of claim 20, wherein the step of executing comprises executing a classification procedure that compares a template of Fast Fourier Transform (FFT) data for a portion of a known signal pulse against spectral information for a portion of a signal pulse determined to occur in the frequency band.

28. The method of claim 27, wherein the step of executing comprises comparing a template describing spectral information for a beginning portion of the known signal against FFT data for the beginning portion of a detected signal pulse.

29. A processor readable medium encoded with instructions that, when executed by a processor, cause the processor to classify signals occurring in a frequency band, by:
   a. generating signal pulse data by computing spectral information representing the radio frequency energy and comparing the spectral information with a set of signal pulse characteristics that comprises ranges for center frequency, duration and bandwidth to produce signal pulse data for pulses that meet the set of signal pulse characteristics;
   b. accumulating over a time interval signal pulse data for signal pulses detected in the frequency band, wherein the accumulated signal pulse data comprises the start time, center frequency, bandwidth and duration for each detected signal pulse; and
   c. executing against the signal pulse data a plurality of classification procedures to classify signals occurring in the frequency band, wherein each classification procedure is associated with a particular signal type.

30. The processor readable medium of claim 29, and further comprising instructions encoded on the medium, that when executed by the processor, cause the processor to designate for one or more signal pulses in the accumulated signal pulse data an identifier corresponding to the classification procedure that achieves a match to the one or more signal pulses.

31. The processor readable medium of claim 29, and further comprising instructions encoded on the medium, that when executed by the processor, cause the processor to executing each of the plurality of classification procedures comprises detect multiple instances of the same signal type.

32. A method for classifying signals occurring in a frequency band, comprising:
   a. comparing a pulse timing template defining a period between at least two signal pulses against data representing signal pulses detected in the frequency band and declaring that a particular signal is occurring when a percentage of matches to the pulse timing template occur over a first time interval exceed a first threshold;
   b. subsequent to said declaring, continuing to compare the pulse timing template against the data over a second time interval; and
   c. declaring termination of the particular signal when a percentage of matches to the pulse signature template over the second time interval do not exceed a second threshold, and otherwise continuing to maintain that the particular signal is occurring;
   d. wherein the first threshold is greater than the second threshold.

33. The method of claim 32, and further comprising the step of adjusting the pulse timing template to account for drift over time between the template and the signal that has been determined to match the template.

34. The method of claim 32, and further comprising the step of estimating the drift between the signal and the template.

35. The method of claim 32, and further comprising the step of generating the data derived from radio frequency energy simultaneously received across the entire frequency band for intervals of time.

36. The method of claim 32, and further comprising the step of generating the data derived from radio frequency energy received by a receiver scanned across portions of the frequency band, and dwelling on each portion for a time interval.

37. A method for classifying signals occurring in a radio frequency band comprising:
   a. accumulating over time signal pulse data for signal pulses detected in the frequency band, wherein the accumulated signal pulse data comprises the start time, center frequency, bandwidth and duration for each detected signal pulse;
   b. executing a classification procedure against the accumulated signal pulse data, wherein the classification procedure compares against the accumulated signal pulse data a timing template describing at least one time period between signal pulses that satisfy defined ranges for bandwidth, duration and center frequency, to determine whether a particular signal is occurring in the frequency band; and
   c. designating for one or more signal pulses in the accumulated signal pulse data an identifier associated with the classification procedure when a match is determined with respect to the one or more signal pulses, thereby tracking which signal pulses in the accumulated signal pulse data are associated with a match to the particular signal.

38. The method of claim 37, and further comprising the step of determining multiple instances of the same signal type occurring in the frequency band.

39. A method for classifying signals occurring in a radio frequency band, comprising steps of:
   a. generating data derived from received radio frequency energy in a frequency band when a radio receiver is scanned across the radio frequency band and dwells for a period of time at portions of the frequency band;
   b. examining the data derived from received radio frequency energy;
   c. preliminarily determining occurrence of a particular signal type in the frequency band based on the data; and
   d. applying a classification procedure for the particular signal against data obtained when a radio receiver is tuned to only those portions of the radio frequency band in which the particular signal type is known to occur.

40. The method of claim 39, wherein the step of generating data comprises generating spectral data derived from the received radio frequency energy, and the step of examining comprises examining the spectral data.

41. The method of claim 39, wherein the step of generating data comprises generating signal pulse data for pulses of radio frequency energy detected in the frequency band over time.

42. The method of claim 41, wherein the step of generating signal pulse data comprises computing spectral information representing received radio frequency energy and comparing the spectral information with a set of signal pulse characteristics that comprises ranges for center frequency, duration and bandwidth, and outputting signal pulse data for pulses that meet the set of signal pulse characteristics.

43. A method for classifying signals occurring in a radio frequency band, comprising steps of:
  a. generating power versus frequency data derived from received radio frequency energy in the radio frequency band; and
  b. comparing a power template describing power versus frequency characteristics for a particular signal against the power versus frequency data derived from the received radio frequency energy to determine whether the particular signal is occurring in the radio frequency band.

44. The method of claim 43, wherein the step of comparing comprises comparing each of a plurality of power templates describing power versus frequency characteristics associated with the particular signal against the power versus frequency data derived from the received radio frequency energy, wherein the particular signal is declared to be occurring when the power versus frequency data matches any one of the plurality of power templates.

45. The method of claim 43, wherein the step of comparing comprises comparing each of a plurality of power templates against power versus frequency data obtained during multiple time intervals, and wherein the particular signal is determined to be occurring when the power versus frequency data matches at least one of the plurality of power templates for each of a predetermined number of time intervals of power versus frequency data.

46. The method of claim 43, wherein the step of comparing comprises comparing each of a plurality of power templates against power versus frequency data for multiple time intervals, and wherein the particular signal is determined to be occurring when the power versus frequency data matches all of the power templates over the multiple time intervals.

47. The method of claim 46, wherein the step of executing comprises executing a classification procedure that requires a match to a different one of the plurality of power templates during each of the multiple time intervals.

48. The method of claim 43, wherein the power template describes average power versus frequency characteristics for the particular signal, and wherein the step of comparing comprises comparing the power template with average power versus frequency data derived from the received radio frequency energy for a time interval.

49. The method of claim 43, wherein the power template describes maximum power versus frequency characteristics for the particular signal, and wherein the step of comparing comprises comparing the power template with maximum power versus frequency data derived from the received radio frequency energy for a time interval.

50. A method for classifying signals occurring in a radio frequency band, comprising steps of:
  a. accumulating over time signal pulse data for signal pulses detected in the frequency band, wherein the accumulated signal pulse data comprises the start time, center frequency, bandwidth and duration for each detected signal pulse; and
  b. executing a classification procedure against the accumulated signal pulse data, wherein the classification procedure compares against the accumulated signal pulse data a timing template describing at least one time period between signal pulses that satisfy defined ranges of at least one or bandwidth, duration and center frequency, to determine whether multiple instances of the same signal type are occurring in the frequency band.

51. The method of claim 50, and further comprising the step of comparing the timing template against the accumulated signal pulse data multiple iterations, each iteration at a different time offset with respect to the accumulated signal pulse data in order to detect multiple occurrences of the same signal type.

52. The method of claim 50, and further comprising the step of designating for one or more signal pulses in the accumulated signal pulse data an identifier associated with the classification procedure when a match is determined with respect to the one or more signal pulses, thereby tracking which signal pulses in the accumulated signal pulse data are associated with a match to the particular signal.

* * * * *